United States Patent [19]

Withers et al.

[11] Patent Number: 5,876,684

[45] Date of Patent: Mar. 2, 1999

[54] METHODS AND APPARATI FOR PRODUCING FULLERENES

[75] Inventors: James C. Withers; Raouf O. Loutfy, both of Tucson, Ariz.

[73] Assignee: Materials and Electrochemical Research (MER) Corporation, Tucson, Ariz.

[21] Appl. No.: 930,818

[22] Filed: Aug. 14, 1992

[51] Int. Cl.$^6$ ................................................. C01B 31/02

[52] U.S. Cl. ..................... 423/445 B; 423/460; 204/173; 204/157.47; 204/157.41; 204/157.43; 204/192.15

[58] Field of Search ................................. 423/445 B, 460; 204/173, 157.47, 157.41, 157.43, 192.15

[56] References Cited

U.S. PATENT DOCUMENTS

| 961,912 | 6/1910 | Tone | 423/448 |
|---|---|---|---|
| 2,165,820 | 7/1939 | Smyers | 204/171 |
| 3,904,501 | 9/1975 | Lagow | 204/164 |
| 4,767,608 | 8/1988 | Matsumoto et al. | 423/446 |
| 5,227,038 | 7/1993 | Smalley et al. | 204/173 |
| 5,316,636 | 5/1994 | Bunshah | 204/157.47 |

FOREIGN PATENT DOCUMENTS 9200427  3/1992  WIPO.

OTHER PUBLICATIONS

Haufler, et al. "Carbon Arc Generation of C60", Materials Research Society Symposium Proceedings, pp. 627–637, Jul. 1991.

Howard, et al. "Fullerene C60 and C70 in Flames", Nature, pp. 139–141, Jul. 11, 1991.

Koch, et al. "Preparation of Fullerenes With a Simple Benchtop Reactor", J. Organic Chemistry, 4543–4545, Jul. 5, 1991.

Wilson, et al. "Imaging C60 Clusters Using a Scanning Tunneling Microscope", Nature, pp. 621–622, Dec. 13, 1990.

Perry, ed. "Perry's Chemical Engineering Handbook", 6th ed., 1984 (no month), pp. '9–58'and '9–59'.

Haufler, et al. "Efficient Production of C60 . . . Buckide Ion", J. Physical Chem., pp. 8634–8636, Nov. 1990.

Haufler et al, "Efficient Production of $C_{60}$ (Buckminster-–fullerene), $C_{60}H_{36}$, and the Solvated Buckide Ion", The Journal of Physical Chemistry, vol. 94, No. 24, 8634–8636, Nov. 29, 1990.

Carl et al, "Fullerenes", Scientific American, Oct. 1991, 54–63.

Koshland, Jr., "Molecule of the Year", Science, vol. 254, No. 5039, 1705, Dec. 20, 1991.

Krätschmer et al, "Solid $C_{60}$: A New Form of Cairbon", Nature, vol. 347, No. 6291, 354–358, Sep. 27, 1990.

Diederich et al, "Higher Fullerenes: Isolation and Characterization of $C_{76}, C_{84}, C_{90}, C_{94}$, and $C_{70}O$, and Oxide of $D_{5h}$–$C_{70}$", Science, vol. 252, No. 5005, 548–551, Apr. 26, 1991.

"Buckyballs: Wide Open Playing Field for Chemists", Science, vol. 254, No. 5039, 1706–1707, Dec. 20, 1991.

Smalley, "Self–Assembly of the Fullernes", Accounts of Chemical Research, vol. 25, No. 3, 98–105, Mar. 1992.

Baum, "Fullerenes in Flames: Burning Benzene Yields $C_{60}$ and $C_{70}$", Chemical and Engineering News, Jul. 15, 1991, p. 6.

Howard et al, "Fullerenes $C_{60}$ and $C_{70}$ in Flames", Nature, vol. 352, 139–141, Jul. 11, 1991.

McKinnon et al, "Combination Synthesis of Fullerenes", Combustion and Flame, vol. 88, 102–112 (1992).

(List continued on next page.)

Primary Examiner—Gary P. Straub
Assistant Examiner—Peter DiMauro
Attorney, Agent, or Firm—Jerome M. Teplitz

[57] ABSTRACT

Fullerenes are synthesized by subjecting carbon in the form of particulates or as the carbon of a liquid or gaseous hydrocarbon, that can be continuously fed to a variety of intense, heat-generating processes that vaporize the carbon from the fluid comprising the particulates or hydrocarbons into an environment that condenses the vaporized carbon to the new form of carbon fullerenes.

69 Claims, 10 Drawing Sheets

OTHER PUBLICATIONS

Howard et al, "Fullerenes Synthesis in Combustion", *Carbon*, vol. 30, No. 8, 1183–1201 (1992).

Danle et al, "$C_{60}$ and Liquid Crystal Mesophase", *J. Pys. Chem.* vol. 95, 8425–28, Oct. 31, 1991.

IBM Technical Disclosure, vol. 34, No. 4B, Sep. 1991.

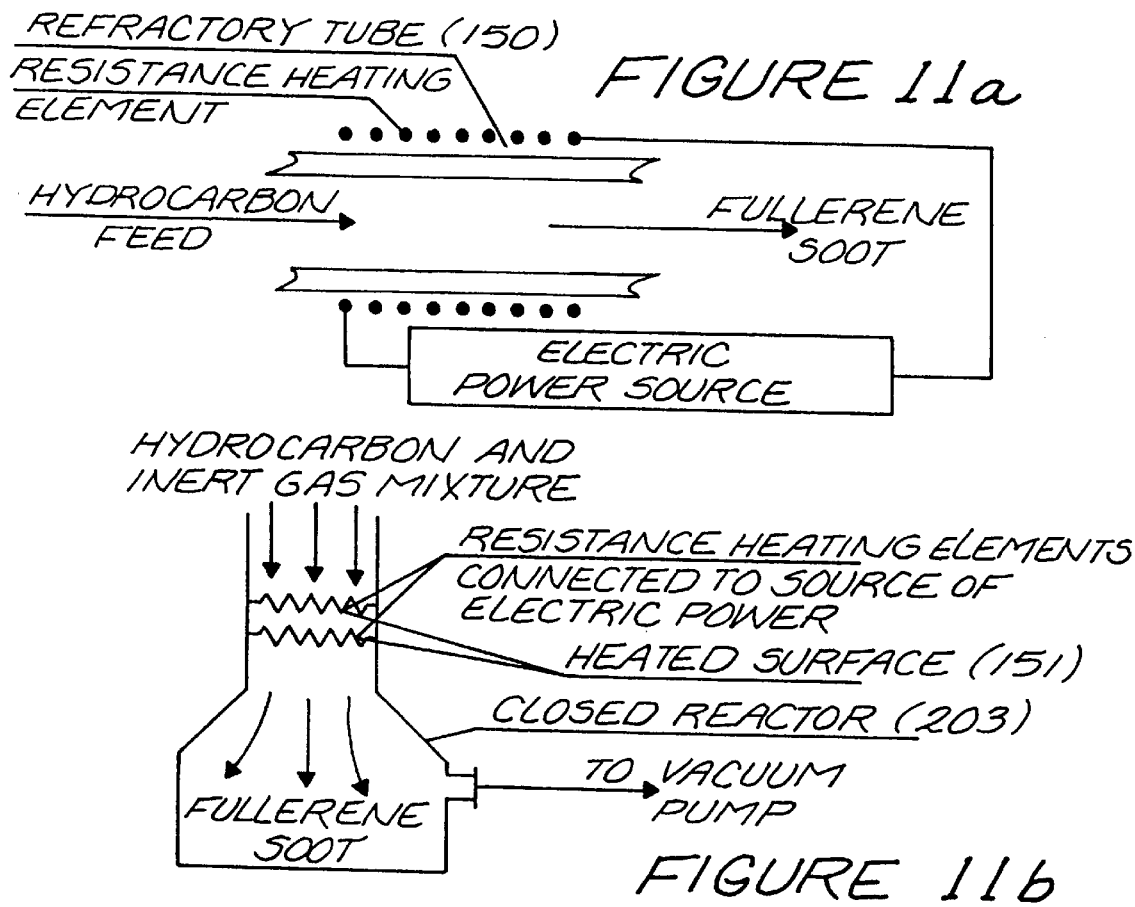
FIGURE 11a
FIGURE 11b
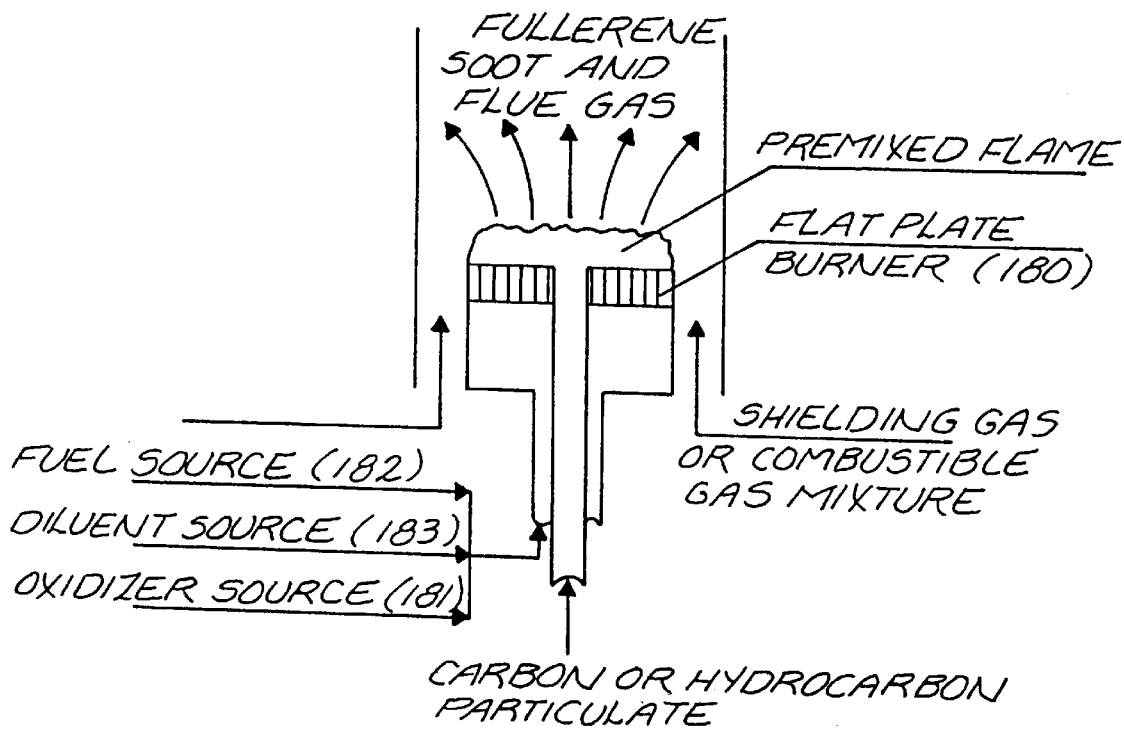
FIGURE 12

METHODS AND APPARATI FOR PRODUCING FULLERENES

This invention relates to improved methods to synthesize the new form of carbon referred to as fullerene, Buckminsterfullerene and Buckyballs and to novel apparatus suitable for carrying out such methods.

BACKGROUND OF THE INVENTION

Huffman, Krätschmer et al. *Nature*, vol. 347, No. 6291, pg. 354–358, 27 Sep. 1990, disclosed a process for synthesizing $C_{60}$ and $C_{70}$ which consists of vaporizing small graphite rods via resistance heating or arcing in a non-oxidizing atmosphere of helium at a preferred pressure of 100 torr. The process is excellent for producing fullerenes. The soot yield from a graphite rod is generally up to about 60% and the soot contains up to about 10% fullerenes. Attempts to scale up this process via using larger graphite rods, for example greater than ¼ to ½ inch diameter, result in lower yields of soot and fullerenes. High power vaporization of the graphite rods reduces yields. The most convenient way to vaporize the graphite rods is a controlled arc between the rods. Automation of graphite rod feeding with a controlled arc to produce large quantities of fullerenes is difficult due to alignment of the small rods for arcing, and automation of supplying a new graphite rods after the rods have been burned in the 100–200 torr helium environment is also difficult. Graphite rods are also an expensive source of carbon.

OBJECTS AND ADVANTAGES OF PRESENT INVENTION

It is an object of the present invention to overcome the scale-up difficulties of the Huffman/Krätschmer graphite rod vaporization process, as well as provide an improved method for synthesizing fullerenes and to provide apparatus suitable for practicing such methods. These and other objectives are achieved in accordance with one aspect of the instant invention by use of a form of carbon that can be poured or fed to the place of vaporization as a fluid in a stream or flow of particles or powder or as a liquid or gas comprising in whole or in part carbon which is vaporized and condensed to produce fullerenes. A preferred embodiment of the invention involves the use of carbon particulates which may be in a stationary bed when vaporized or which may be continuously fed as a fluid stream of particles to the reaction zone where it is heated and vaporized. As contrasted to graphite rods, carbon particulate can readily be continuously fed into a non-oxidizing atmosphere at 100–200 torr or other pressures that were discovered in accordance with the instant invention which cover the range of $10^{-6}$ torr to 760 torr.

It is a further object of this invention to provide improved methods and means for vaporizing carbon in the production of fullerenes. These techniques are particularly useful to vaporize carbon powder or particulate as it is supplied continuously to a reaction zone where the heat is applied. Advantageously, the heat is supplied by appropriate means for producing an arcs plasma, electron beam, ion beam, laser beam or the like for causing solid particulate carbon to vaporize.

It is also among the objects of this invention to provide improved methods and apparatus for producing fullerenes wherein the source of carbon comprises a hydrocarbon that may be in a gas, liquid or solid form and which may also comprise the quenching medium when in the form of a gas or liquid.

SUMMARY OF THE INVENTION

In accordance with the present invention, a fluid form that may be carbon particulates or a form of hydrocarbon in a liquid or gaseous state or as a particulate are continuously fed to the vaporization zone or reaction zone supplied with heat from the source in an atmosphere and under other conditions that cause the vaporized carbon to form fullerene structures which includes $C_{60}$, $C_{70}$ and carbon forms of higher molecular weight having the structural configuration of fullerenes. The fullerene structure can be that known in the art which consists of hexagons and pentagons to form closed structures as well as tubular shapes.

One embodiment of the instant invention is a process of producing fullerenes by vaporizing particulate forms of carbon in an environmental condition that forms fullerenes, as well as apparatus to carry out this process.

The instant invention utilizes a variety of heat or power generating sources that are effective to vaporize large quantities of carbon on a continuous basis. To overcome the limitations of precision feeding graphite rods on a continuous basis and the limitation for scaling to large size such as greater than ½ inch diameter rods, a preferred embodiment of the instant invention utilizes means to feed particulate carbon continuously as a fluid stream of particles to an intense heat generating source, such as an arc, electron beam, plasma that include electrodeless type sources such as induction, microwave, sputtering and lasers. The heat generating systems are preferably configured to maximize the heat in a unit area to which carbon particulate is continuously fed and vaporized under conditions that maximize the formation of fullerenes. The gases utilized in the heat or plasma systems are non-oxidizing such as the noble gases including helium and argon, and may be a reactive gas such as hydrocarbon preferably with a low hydrogen to carbon ratio. In certain embodiments, the hydrocarbon in either liquid or gaseous form may serve as both the source of carbon for the fullerenes and as the quenching medium. The processing conditions that surround the carbon particulate during vaporization are those that are known to stimulate the formation of fullerenes such as an atmosphere of 100–200 torr, as known in the cited article published by Huffman, et. al., as well as broader range in accordance with embodiments of the present invention which extend from about $10^{-6}$ torr to 760 torr. Also employed are controlled quenching conditions which stimulate the formation of fullerenes such as temperature controlled condensation surfaces created by additional heating or cooling that include baffles, shrouds, etc., which are utilized to maximize the formation of fullerenes of various molecular weights and structures.

Any source of particulate carbon which includes graphite, amorphous, glassy, carbon black, soot, reclaimed carbon or even the fullerene form, is vaporized by an appropriate energy source in conjunction with condensation conditions to form fullerene molecular structures that include tubular shapes. Convenient and economical heat sources suitable to vaporize particulate carbon are electric arc, plasma, microwaves, lasers, electron beam and sputtering, which may also be loosely described as plasma or ion beam vaporization. The carbon can also be vaporized through combustion and the combustion-vaporized carbon can be condensed as fullerenes. Descriptions of preferred embodiments of apparati and techniques for vaporizing carbon in the form of particulates and other forms that are quenched or condensed into fullerenes follow.

In accordance with certain embodiments wherein the vaporized carbon is produced from hydrocarbons, whether in liquid, gaseous or particulate form, the fullerene synthesis process may be carried out by pyrolyzing, cracking or combusting the hydrocarbon to provide the carbon atoms that are vaporized and condensed to form fullerenes. Thus, the carbon atoms may be derived from the hydrocarbons through breakdown of hydrocarbons in the gaseous liquid or solid phase using an appropriate source of heat, as described hereinafter.

DESCRIPTION OF THE FIGURES

FIGS. 11a and 11b are a schematic representations of other forms of the system of FIG. 1 wherein hydrocarbon is used as the source of carbon to produce fullerenes and the heating source comprises electric resistance elements.

FIG. 12 is a schematic representation of another form of the system of FIG. 1 wherein the source of carbon can be carbon particulate or a hydrocarbon or a combination thereof and the heat of vaporization is provided by a flat plate burner.

DESCRIPTION OF PREFERRED EMBODIMENTS

Arc Vaporization

Figure 1:
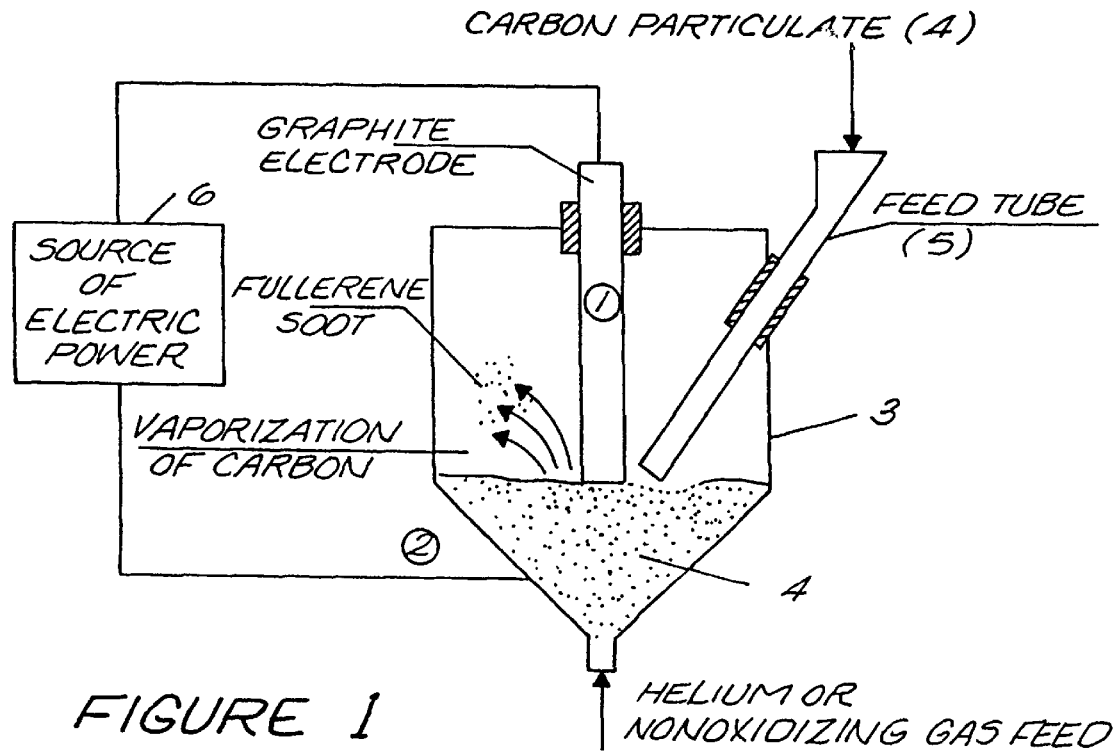
FIG. 1 is a schematic representation of apparatus according to the present invention wherein particulate carbon is continuously fed to a reaction zone heated by an arc system.

FIG. 1 shows one arc-type configuration that utilizes carbon particulates to synthesize fullerenes and wherein the carbon particulate may be continuously fed by a feed tube 5 to the reaction zone where an arc is produced. A pair of spaced electrodes 1 and 2 are connected to a suitable source of electric power 6 to generate an arc between them for heating the carbon particulates 4 in a reaction zone within the reactor 3 to provide vaporization of the carbon. The electrodes 1 and 2 are disposed within a reactor 3 comprising a container formed of metal or other material effective to contain the quenching gas at the requisite atmospheric pressure. An arc between electrode 1, which is in the form of a rod, and the other electrode 2, which comprises a container for the particulate carbon 4 to be vaporized. The container 3 may comprise a graphite crucible for holding the carbon particulate 4 near the tip of the electrode rod 1 provides the most efficient vaporization. The composition of the rod forming electrode 1 can be graphite or any refractory material that will conduct electric current such as refractory metals of tungsten, molybdenum, tantalum and other alloys or ceramics such as carbides, borides, nitrides, oxides, etc. The electrical power applied between the electrodes 1 and 2 can be standard alternating current, direct current, high frequency current with various wave configurations, alternating current superimposed on direct current and any power type may be pulsed. In the case of direct current if the particulate carbon comprising electrode 2 is the anode, higher burning rates of the carbon is achieved.

Although not essential for the production of fullerenes, in accordance with a preferred aspect of the invention the helium or non-oxidizing quenching gas is fed directly into the vaporization area, as shown, thereby providing a convenient and effective way to transport the produced carbon soot away from the vaporization area, as well as providing the quenching to improve the efficiency of fullerene formation.

In accordance with other forms of the invention, the quenching gas may be introduced in the chamber comprising the reactor 3, through a passageway (not shown) that may be provided in electrode one through feed tube 5 or fed just generally in container 3. The gas can be helium, argon or any noble gas, or a hydrocarbon which can be pyrolyzed to enhance carbon soot formation and the production of fullerenes. If a hydrocarbon is utilized, the lower the hydrogen to carbon ratio the better with respect to hydrogen interfering with cage closure in the formation of fullerenes. Examples of low hydrogen/carbon ratio compounds are acetylene, benzene, naphthalene, anthracene, naphthacene, etc.

The atmospheric conditions in container 3 are those effective to enhance the formation of fullerenes such as $10^{-6}$–760 torr of an inert quenching gas such as a noble gas, helium being used in a preferred embodiment. In a further embodiment the quenching gas may be a hydrocarbon as described above. Steep temperature gradient fixtures in the reactor, can be an asset to enhance fullerene formation such as water cooled chimneys, shrouds, covers, etc., may also be utilized in chamber 3 to enhance the yield of fullerenes through condensation of the vaporized carbon. Baffles that are not water cooled such as graphite shrouds can also enhance the yield of fullerenes.

Advantageously, means are provided for cooling the region surrounding the reaction zone in the chamber 3 to enhance quenching of the vaporized carbon and its condensation and the collection of fullerenes. This may be done by the use of an appropriate heat exchanger such as water cooled copper coils surrounding the electrodes 1 and 2.

Figure 2:
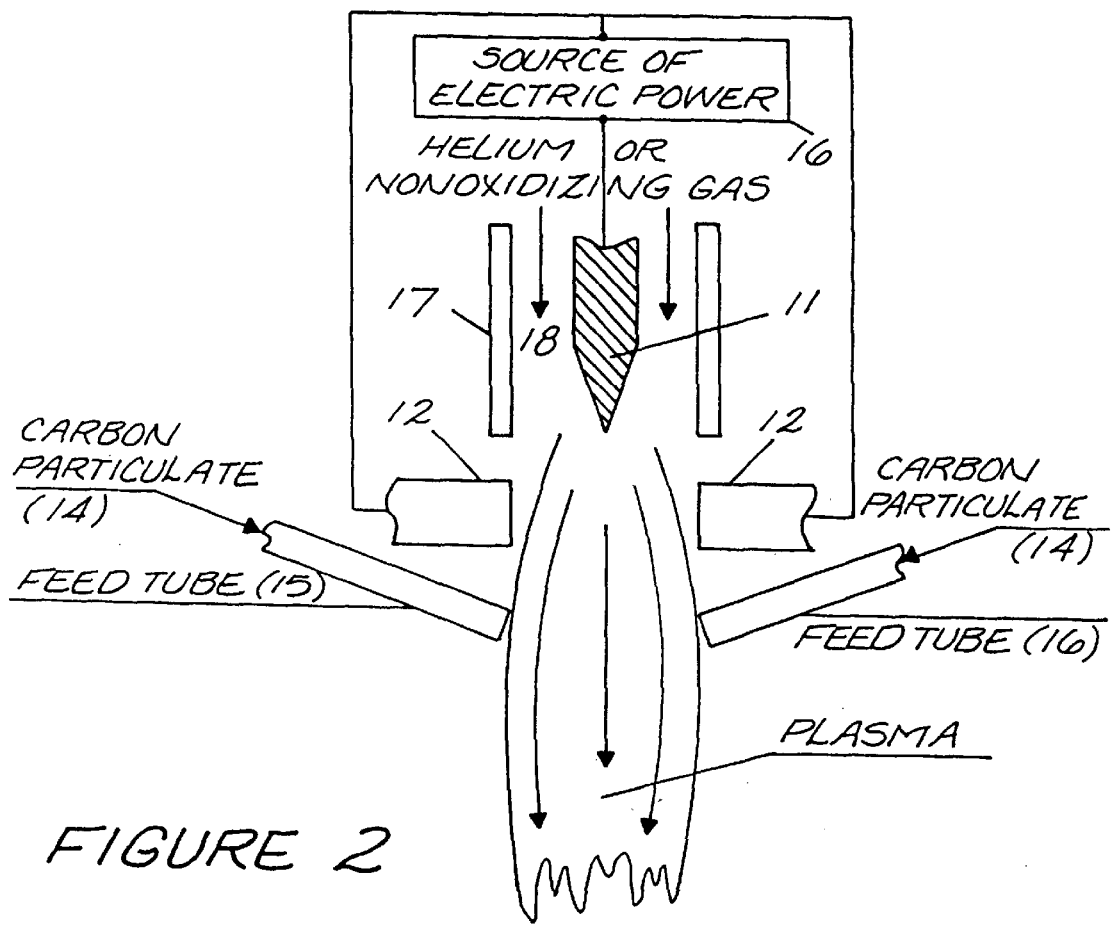
FIG. 2 is a schematic representation of apparatus similar to that shown in FIG. 1, but wherein the arc system is replaced by an arc plasma system for heating the reaction zone and wherein the particulate carbon is fed to a reaction zone down-stream of the electrodes.

FIG. 2 depicts a system generally like that of FIG. 1, but wherein the heat generating system disposed within the reactor 3 of FIG. 1, comprises an arc plasma system utilizing technology similar to that used for power spray of coatings. In the system shown in FIG. 2, carbon particulates 14 of select size that can be vaporized in the arc are fed to an arc produced between a pair of spaced electrodes, 11 and 12, that are connected to a source of electric power 16, similar to the power source 6 of FIG. 1. The first electrode 11 is shown as a tapered rod disposed within and spaced from a surrounding tube 17, whereby the annular space 18 surrounding the rod electrode 11 provides a conduit for the flow of inert quenching gas past the electrode to the arc at the reaction zone between rod electrode 11 and the second electrode 12 shown as a plate having a generally circular aperture opposite the tip of rod the electrode 11. The carbon particulates 14 fed to the arc produced between electrodes 11 and 12 are vaporized and quenched to form fullerenes. As with fullerenes produced in the system of FIG. 1, the quenched fullerenes are condensed on the inner walls of the container 3. Any particulate that is not vaporized or that condenses as non-fullerenes is recycled. The actual configuration of the arc is not critical, except that is must operate to vaporize the carbon particulates. Arcs that utilize tubular shapes, double helix flow patterns, high enthalpy configurations are excellent for vaporizing the carbon particulate.

The gas utilized in the arc process can be a noble gas such as helium, argon, xenon, or any non-oxidizing gas which can also include hydrocarbons such as listed in the description of FIG. 1. The hydrocarbons may be added with the inert gas or exclusive of the inert gas.

The chamber 3 surrounding the arc plasma should be closed to prevent oxidizing conditions, and to facilitate the generation of pressures and quenching conditions to produce fullerenes. In addition to the inner walls of chamber 3, collector devices, cooled plates, baffles, shrouds, etc., may also be used to enhance condensation of the vaporized carbon in the chamber 3 to enhance fullerene formation.

Figure 3:
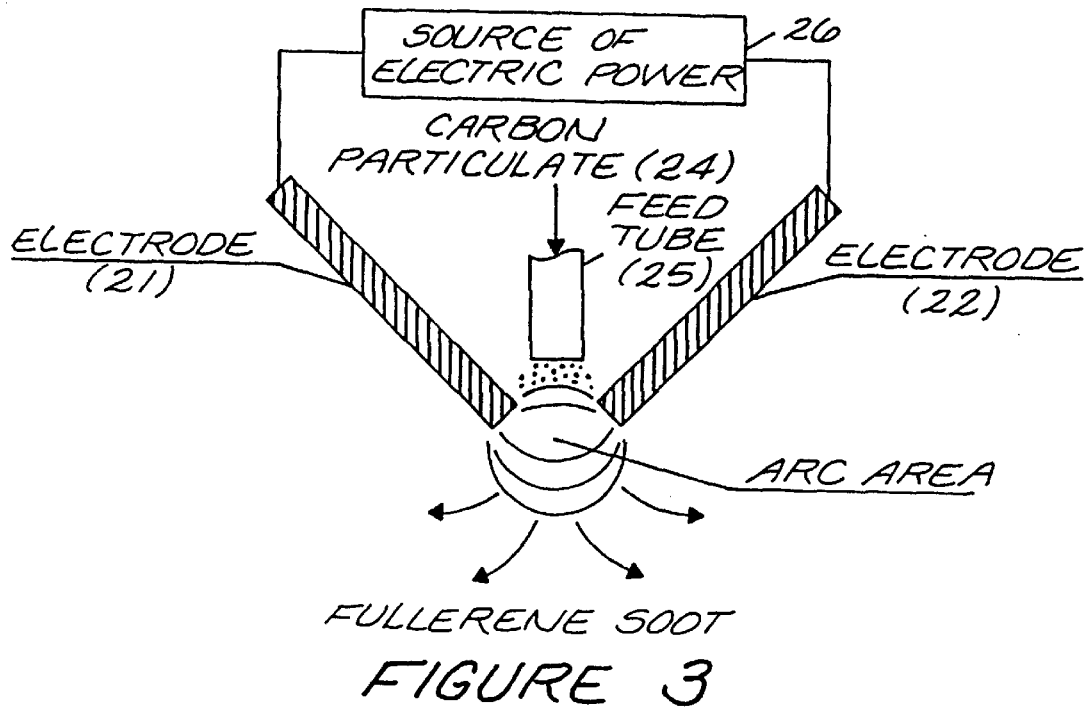
FIG. 3 is a schematic representation of another form of the arc system shown in FIG. 2, wherein the carbon particulate is fed directly through the electrodes to provide more efficient heating to vaporize the carbon.

In FIG. 2 the carbon particulate 14 is fed through first and second feed tubes 15, 16 to the vaporization zone or reaction zone down-stream of the electrodes 11, 12, which is similar to the procedure used in a typical arc plasma powder spray system. In some cases to provide additional heat to vaporize the carbon particulates, it is desirable to feed the particulates such that they pass through the arc of the electrodes. FIG. 3 shows such a system in which the carbon particulate is fed through the electrodes within the chamber 3 of FIG. 1, to achieve maximum heating to vaporize the carbon particulates. In the system of FIG. 3, the arc is produced between first and second spaced electrodes shown as rods 21 and 22 disposed at oblique angles. The electrodes 21, 22, can be graphite or the same materials listed for the rod-type electrode 1 shown in FIG. 1. The carbon particulate 24 is fed through a feed tube 25, and flows by gravity or carried by a feed gas such as helium, argon, or a hydrocarbon into the reaction zone produced by an arc between the tips of the spaced electrodes 21 and 22 caused by the application of electric power from the source 26 connected to the electrodes 21 and 22. The quenching gases including hydrocarbon for the arc, the collection of soot and containment to establish conditions to stimulate fullerene formation, is the same as described in FIG. 1. The source of electric power may be as described for the source 6 of FIG. 1.

Figure 4:
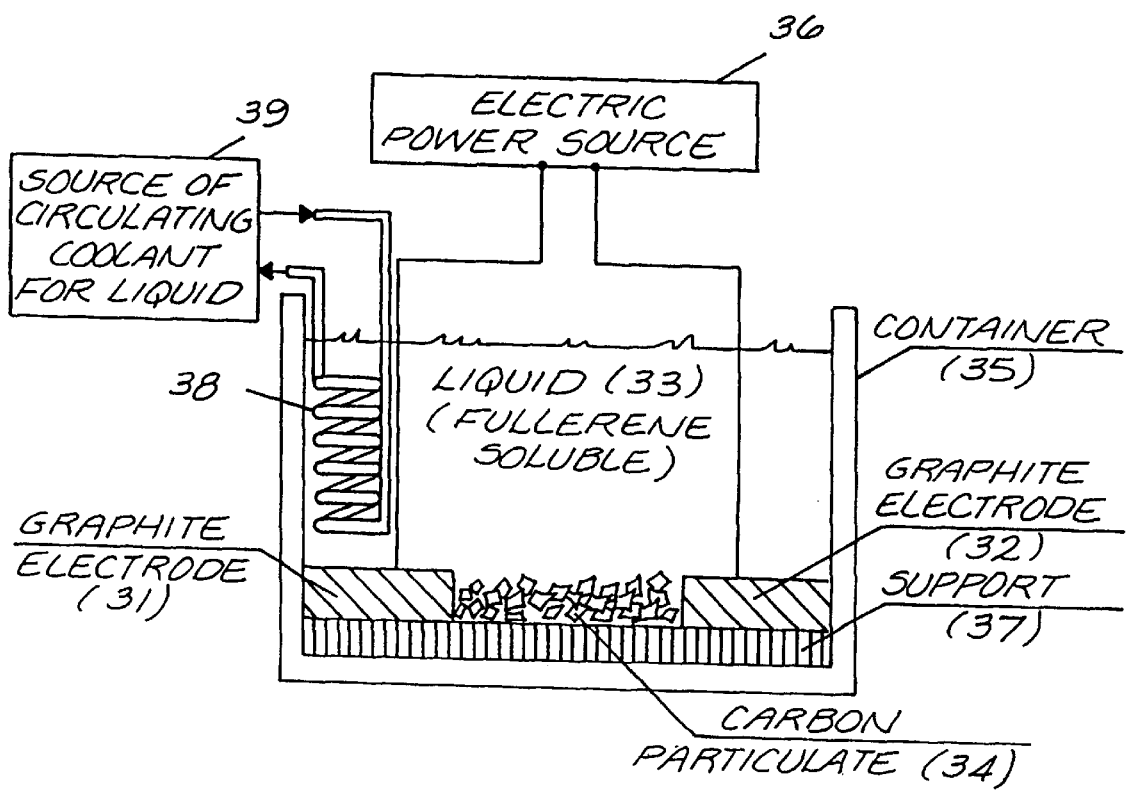
FIG. 4 is a schematic representative of a further embodiment of the invention wherein the electrode system for heating the carbon is immersed in a liquid, such as benzene, that is suitable for quenching the vaporized carbon and for solubilizing fullerenes.

Another embodiment of the invention is shown in FIG. 4. Unlike the system shown in FIG. 3, wherein the atmosphere surrounding the arc comprises a quenching gas under pressure that is known to form fullerenes, e.g. $10^{-6}$–760 torr and preferably 100–200 torr, in the embodiment shown in FIG. 4 the electrodes system comprises first and second spaced electrodes 31, 32, surrounded by a liquid 33 such as a hydrocarbon that is open to atmospheric pressure. Example liquids may be those that are known to solubilize fullerenes such as benzene, toluene, 1,3,4,5 tetramethylbenzene, methylnaphthalene, etc., In the embodiment shown in FIG. 4, the liquid 33 is contained by a container 35 comprising a reactor that may be open to the atmosphere as shown. The carbon particulates 34 are maintained stationary in the liquid 33 between the electrodes, 31,32, as for example, by means of a screen 37 in the bottom of the container 35 such as a glass beaker. Arcs produced between the electrodes 31, 32 and between the carbon particles 34 in a stationary position are best produced with pulsed power from electric power source 36 that generates sparks between particles 34 to vaporize the particles 34 at the point of the arc, which comprises the reaction zone. Movement of the particles 34 , such as by vibration, generates multiple arc points and consumes the particles 34. The vaporized particles are quenched in the surrounding liquid 33 and fullerenes are immediately soluble in the hydrocarbon liquid 33. The liquid will heat due to the arcing process and to prevent vaporization of the liquid, it must be heat exchanged as by means of the cooling coils 38 through which coolant is continuously circulated from an external cooling system 39 that may be of conventional design. The arcing under the liquid process can be operated with carbon particles 34 between the electrodes 31, 32 and continuously fed from a source of carbon particulate as with the apparatus of FIG. 1, or without, in which case electrodes 31,32 are directly arced.

In the liquid-quench system of FIG. 4, the vaporization of the carbon and quenching thereof take place at atmosphere pressure rather than at the pressure range described for operation of the systems of FIGS. 1, 2 and 3.

Figure 5:
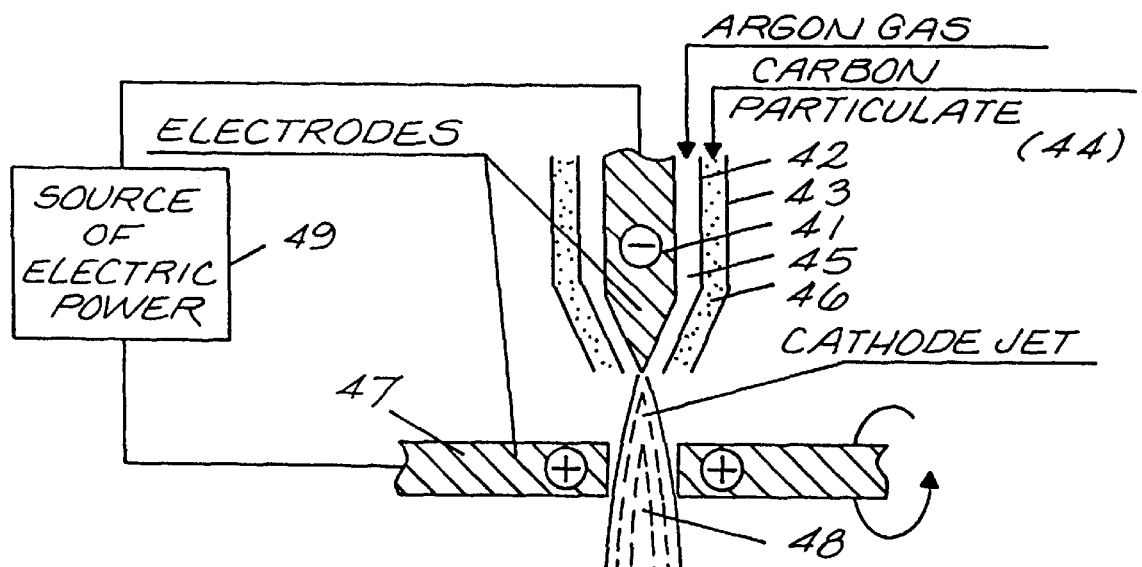
FIG. 5 is a schematic representation of another form of the system of FIG. 1 wherein the heating source comprises an arc type heat generation system.

FIG. 5 depicts an arc type heat source which is referred to as a transferred arc. It is similar to the system shown in FIG. 1 but the rod type electrode 1 of FIG. 1 is replaced in FIG. 5 with the arc type heat generation system wherein a first electrode shown as a tapered rod 41 surrounded by a first and second tubular members 42, 43, the inner tubular member 42 being spaced from the tapered rod 41 to form a first annulus 45 through which quench gas, such as argon, is fed from a source to the reaction zone at the tip of the rod type electrode 41. The first or inner tubular member 42, in turn, is surrounded by a second annulus 46 produced by the space between the inner and outer spaced tubular members 42, 43 through which carbon particulate 44 is fed to the reaction zone opposite the tip of the rod electrode 41. The reaction zone is defined by an arc between the tip of rod electrode 41 and a second electrode shown as a flat plate 47 situated in a plane generally perpendicular to the axis of the rod electrode 41 and having a round aperture 48 directly opposite and spaced from the tip of the rod electrode 41. The carbon particulate 44 is fed through the outer annulus 46 to the arc where it is vaporized. Advantageously, the inner and outer tubular members 42, 43 are also tapered toward the tip of the rod electrode in order to direct the carbon particulate 44 and the quench gas, which may also contain hydrocarbons, more effectively toward the center of the arc. Both the rod electrode 41 and the plate electrode 47 may be formed of solid carbon material or other suitable electrode materials as described for the electrodes of FIG. 1 and 2.

In the system of FIG. 5, the vaporized carbon produced in the reaction zone will, for the most part, pass through the aperture 48 in the plate electrode 47 and the fullerene soot comprising the quenched carbon product will condense and collect upon the walls of the container or reactor 3 (as in FIG. 1) or upon such other condensation and collection surfaces as may be included within the reactor 3 that encloses the reaction zone.

The gases in the arc system, quenching and collection systems, and conditions in the atmospheric controlled systems of FIG. 5 are similar to those described concerning the systems of FIGS. 1, 2 and 3. Likewise, the electrode materials for both or either of electrodes 41 and 45 may be the same as discussed above for electrode 1 of FIG. 1.

In accordance with a further embodiment of the invention utilizing an arc type heat source, the plate electrode (anode) 47 may be a solid block of carbon which will be consumed and provide the source of carbon to be vaporized to produce fullerenes in lieu of the source of particulate carbon 44.

Figure 6:
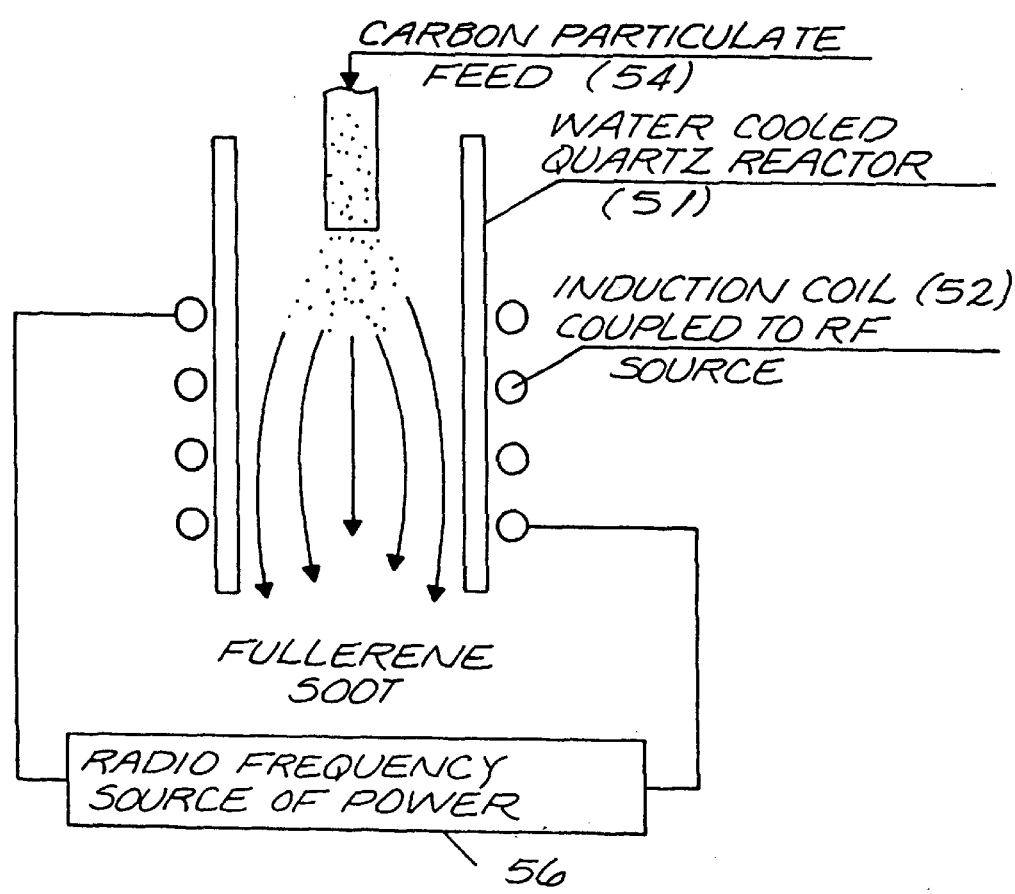
FIG. 6 is a schematic representation of another form of the system of FIG. 1 wherein the heating source comprises an induction plasma type system.

FIG. 6 depicts an induction plasma type heat source to which carbon particulate is fed and vaporized by the induction produced plasma. Of course, a solid carbon rod may be fed into the induction plasma and vaporized. The induction plasma is generated in the reactor by known means such as an appropriate radio frequency generator that operates at KHz or MHz frequencies. In FIG. 6, the reactor 51 is shown made of quartz to afford an appropriate closed container for confining the quenching gas in the heated reaction zone induced by the radio frequency energy produced by the induction coil 52 coupled to the radio frequency power source 56. The plasma gases, the container 51 providing the closure, the atmosphere and collection of fullerenes are function essentially the same as those of FIGS. 1, 2 and 3, as described above. The plasma gases may be the same as the quench gases described for the embodiments of FIGS. 1, 2 and 3 and may include added hydrocarbons as described and listed in regard to the systems of FIGS. 1, 2 and 3.

Figure 10:
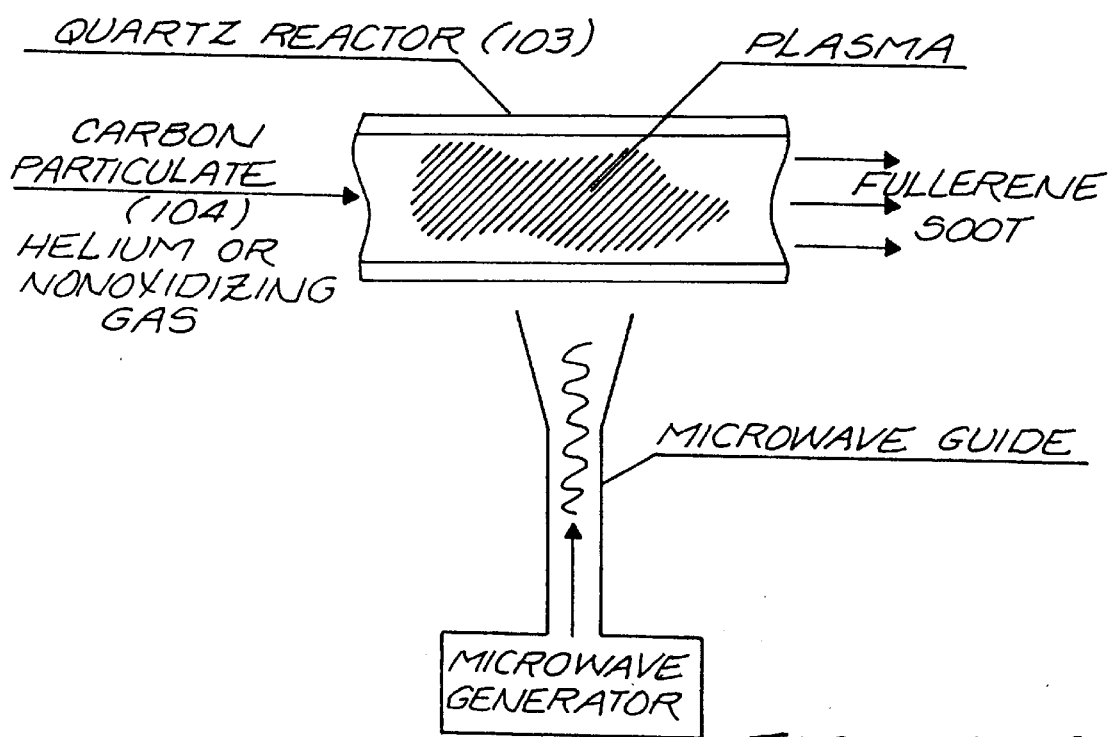
FIG. 10 is a schematic representation of another form of the system of FIG. 6 wherein the heating source comprises a microwave source to induce plasma.

Instead of an induction produced plasma to vaporize the carbon particulates, as shown in FIG. 6, a microwave produced plasma can be utilized to vaporize the carbon particulates. FIG. 10 shows a microwave system for vaporizing carbon particulate 104 which is fed into a quartz reactor 103 into which the requisite quenching gas is also maintained at the effective pressure to provide the conditions for fullerene production when plasma is produced in a reaction zone in the reactor chamber 103 by subjecting it to microwave energy from an appropriate generator coupled to a waveguide to direct the microwaves through the quartz walls into the reactor. The microwave plasma is a special case of the MHz plasma at the specific frequency of 2450 MHz. Lower and higher frequencies can be utilized to generate the plasma to vaporize the carbon particulates or to couple directly to the carbon particulates which may be sized in relation to the frequency of the applied microwave source to create more efficient coupling and thus greater efficiency of heating and vaporizing the particulates. A solid carbon rod, or plate or the like can also be vaporized by the induction, microwave or higher frequency power generation systems. As in the other cases, the plasma or working gases including hydrocarbons, the devices to quench and collect the fullerenes and the container conditions to generate fullerenes are the same as those described in FIG. 1 and 5.

Figure 7:
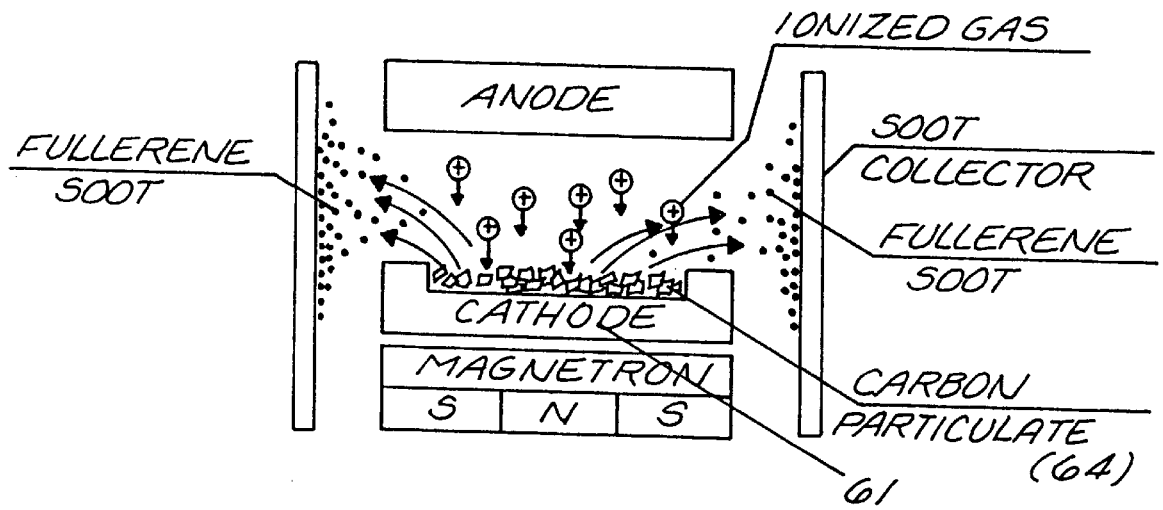
FIG. 7 is a schematic representation of another form of the system of FIG. 1 wherein the heating source comprises a sputtering system.

FIG. 7 depicts yet another system for vaporizing carbon particulates or solid carbon to produce fullerenes. It is a sputtering system in which carbon particles or solid carbon is the cathode 61 in a magnetron type sputtering system. The working gas within the reactor 3 is a noble gas, hydrocarbon or non-oxidizing gas in which ionization occurs and wherein a magnetic field generated by the magnetron is applied to accelerate the ionized gas causing it to collide with the carbon surface and vaporize carbon atoms that are then quenched to form fullerenes. The sputtering system may be powered by a standard direct current (DC) magnetron type depicted in FIG. 7, rf type which may operate over a wide range of frequencies, electron beam type, ion beam or laser type which also can be operated at a wide range of frequencies. The reaction zone is enclosed in a suitable container comprising a reaction for containing the reaction zone, the atmosphere conditions for the quench gas and the condensation and collection surfaces for the fullerenes.

In the system of FIG. 7, the sputtering gases may comprise noble gases and may include hydrocarbons, as described for FIG. 1. Likewise, the collection devices and pressure are the same as described in FIG. 1.

Figure 8:
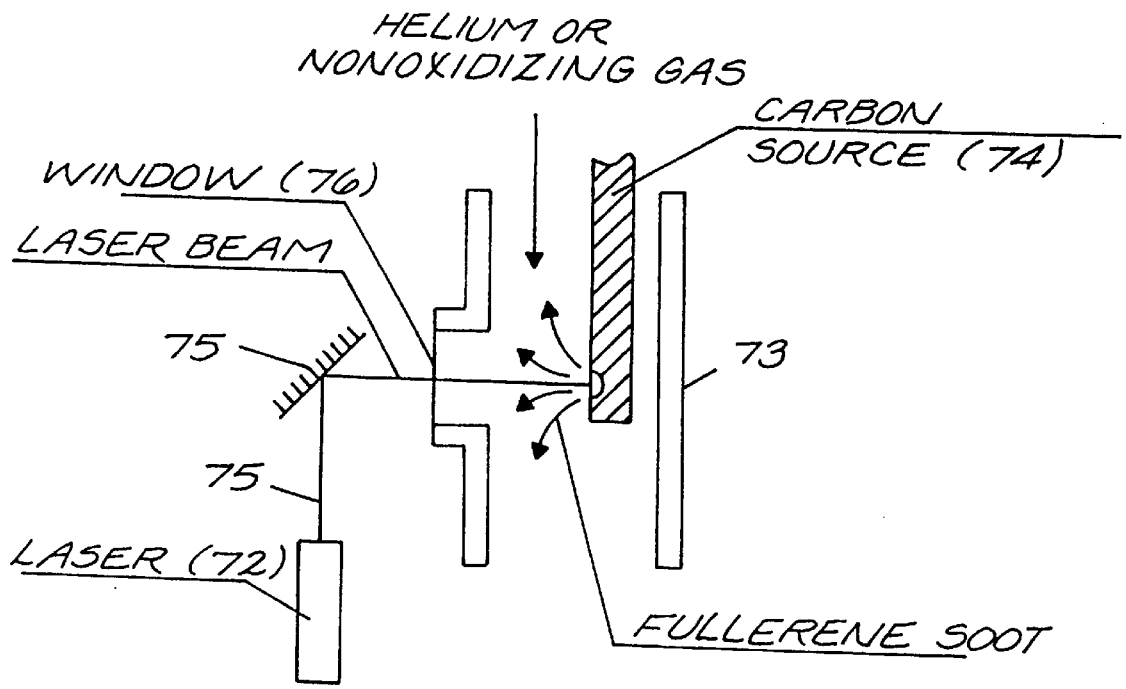
FIG. 8 is a schematic representation of another form of the system of FIG. 1 wherein the heating source comprises a laser system.

FIG. 8 depicts apparatus generally like that of FIG. 1 wherein electrode one of FIG. 1 is replaced with a laser source 72 that vaporizes the carbon particulates 74. The laser source 72 shown in FIG. 8 can be known types such as $CO_2$, YAG, Exmier, etc. As with the system shown in FIG. 6 a laser can be used to vaporize particulates passing through a containment system comprising the reactor 3.

In the system of FIG. 8, there is shown a container 73, comprising a reactor for containing the quenching gas under the atmospheric conditions described for the system shown in FIG. 1, and which is preferably maintained at the pressures described below for laser systems such as laser 72 which is positioned to produce a laser beam 75 that is directed by a mirror 75, through a window 76, in the container 73, to impinge upon a source of carbon 74 in the reaction zone. The laser beam 75 vaporizes the carbon 74, which may be in the form of a rod or plate or in the form of particles and augmented by a totally hydrocarbon source fed into the reactor, thereby producing vaporized carbon that is quenched as fullerenes, collected on the inner walls of the reactor or other condensation surfaces therein and separated as in the system of FIG. 1.

Figure 9:
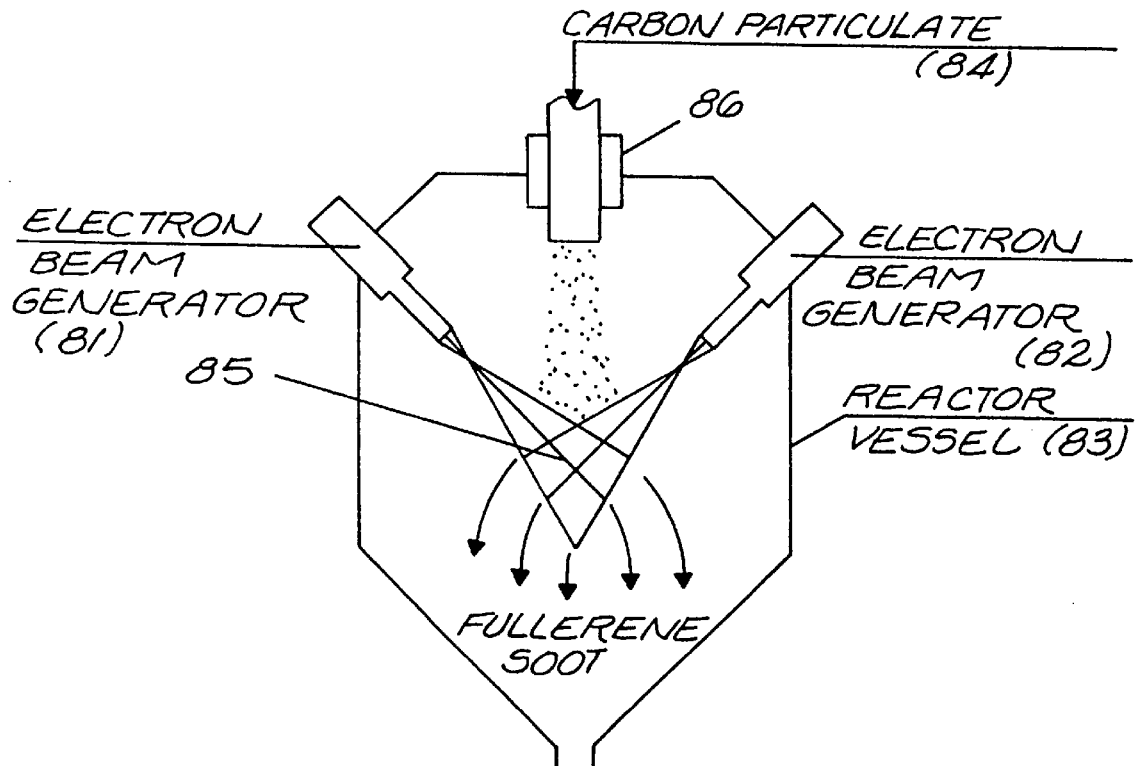
FIG. 9 is a schematic representation of another form of the system of FIG. 1 wherein the heating source comprises an electron beam system.

FIG. 9 depicts another embodiment of the invention similar to FIG. 1 or FIG. 8, wherein the electrode system of FIG. 1 or the laser of FIG. 8 is replaced with an electron beam source which will vaporize the carbon particulates and in the FIG. 1 or 9 arrangements can also vaporize the carbon particulates.

In the system of FIG. 9, there is shown a reactor vessel or container 83 to which a pair of electron beam generators 81 and 82 are mounted for directional electron beams to a reaction zone 85 shown in the center of the reactor 83 and above which is shown in a dispenser 86 for feeding carbon particulate 84 to the region comprising the reaction zone 85 where the electron beams from the two sources 81 and 82 converge and impinge upon carbon particulate 84 introduced or fed to the reaction zone 85, thereby vaporizing the carbon, which is then quenched, condensed and separated as with the systems of FIGS. 1 and 7.

Of course, solid carbon in the form of rods, plates, blocks, etc., or hydrocarbon gases, liquids or solids, can be substituted for carbon particulate 84 in the system of FIG. 9. The electron beam source may be a single source or several sources to vaporize the carbon. Contrary to the 100–200 torr pressure reported by the Huffman et. al., when using carbon rods in an arcing system to vaporize carbon, the use of a sputtering system or electron beam system to vaporize the carbon permits operation at much lower pressures, in the range of $10^{-3}$–$10^{-6}$ torr, with attendant advantages.

To overcome the expense of graphite rods as a source of fullerenes and the scale-up difficulties, hydrocarbons are a near ideal carbon source to synthesize fullerenes. The hydrogen from the hydrocarbons can interfere with the symmetrical closure to form fullerenes and thus should be minimized as much as possible. Accordingly, hydrocarbons with as low a hydrogen/carbon ratio as possible should be used as the precursor to synthesize fullerenes.

The methods of pyrolyzing, cracking or generating carbon atoms in the gas phase to condense and form fullerenes include plasma, combustion and thermal pyrolysis. The conditions of the hydrocarbon breakdown region are set to maximize the formation of fullerenes which are generally known to be an atmosphere of quench gas at 100–200 torr, but in accordance with the present invention, it has been determined that pressures of $10^{-6}$ torr to above one torr and several atmospheres can also nucleate fullerenes.

In accordance with preferred embodiments of the present invention, a hydrocarbon is continuously fed to the carbon generation region, i.e., the reaction zone of the reactor, which provides the economics of continuous operations and can be scaled into large operations as contrasted to prior art graphite rod processes.

Operating conditions of feeding hydrocarbons to a heating source or reaction zone to produce fullerene soot can be varied to produce only select fullerene molecular strengths and structures, such as only $C_{60}$, or other large molecular weight fullerenes, or tubular shapes.

The embodiments of the instant invention for converting hydrocarbons to fullerenes utilizes techniques of intensely heating the hydrocarbon under conditions which favors the formation of fullerenes. The instant invention provides a variety of techniques for heating the hydrocarbons to cause vaporization of carbon clusters and condensation to form fullerenes. The heating techniques include any form of arcs, and especially high enthalpy arcs including passing the hydrocarbon through the arc, electroless plasmas that includes induction types and microwave, thermal processing that includes passing the hydrocarbon over heated surfaces or through beams that cause the hydrocarbon to be intensely heated such as electron beam or laser, and combustion that includes multiconfiguration burners that may also be a sheathed double burner or burner within a burner.

The pyrolytic condition of the hydrocarbons consist of those known to favor fullerene formation which is preferably 100–200 torr but also includes $10^{-6}$ torr up to several atmospheres. The environment of condensing the pyrolyzed hydrocarbon into fullerenes can consist of quenching profiles, that may include heated or cooled surfaces that favor fullerene structure formation.

The hydrocarbon precursor can be any gas, liquid or solid feed to the heating system. Since hydrogen can interfere with fullerene ring closure a low hydrogen/carbon ratio is preferred. Hydrocarbons which have low hydrogen/carbon ratios include acetylene, benzene, naphthalene, anthracene, naphthacene, polynuclear aromatics (e.g. Coronene) etc., which form excellent sources to transform to the fullerene structure.

Figure 13A:
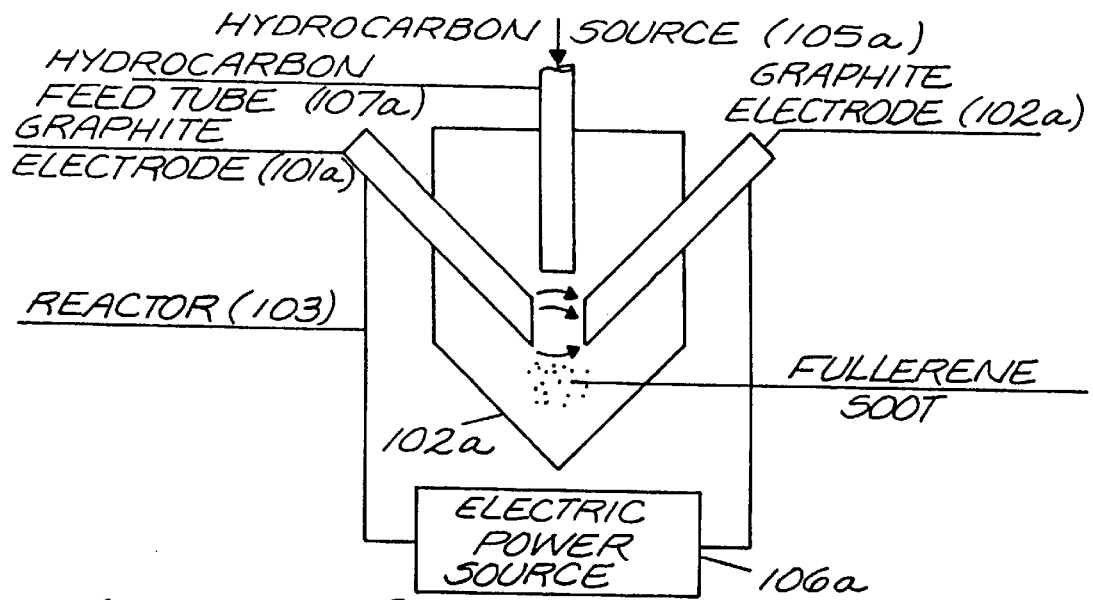
FIGS. 13a and 13b are schematic representations of systems modeled after those of FIGS. 1 and 3 and which are directed to the use of hydrocarbons as the carbon source.
Figure 13B:
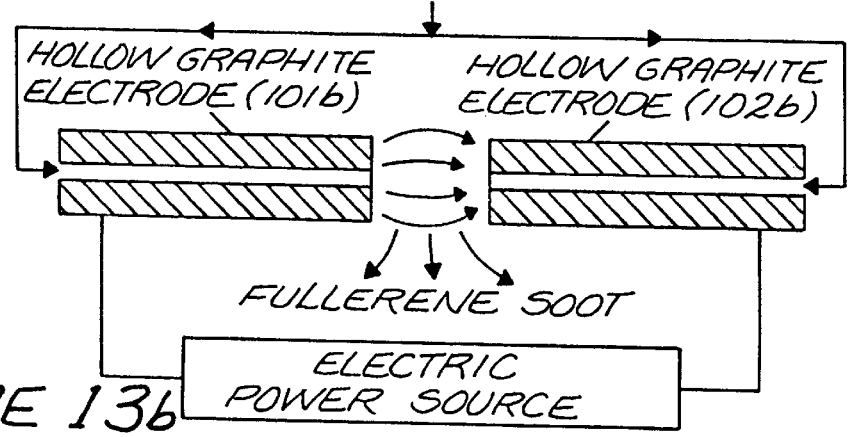

There are a number of arc configurations which can be used to provide the thermal energy that will pyrolyze hydrocarbons under conditions for the formation of fullerenes. The arc types include direct arcs between two electrodes, one electrode and a tube, parallel plates, etc. In any electrode configuration and especially those that provide high enthalpy, the gas is non-oxidizing such as a noble gas or entirely the hydrocarbon. FIGS. 13*a* and 13*b* show electrode systems particularly suited to produce fullerenes through the use of carbon derived from hydrocarbons subjected to an electric arc in an appropriate reactor.

The system of FIG. 13*a* comprises a reactor 103 for containing the hydrocarbons in an appropriate environment to provide for vaporization of carbon and quenching of the vaporized carbon products to provide fullerenes as described herein. First and second rod shaped electrodes 101*a*, 102*a*, which may be similar to electrodes 21 and 22 of FIG. 3, are disposed at an oblique angle to one another with a space between their tip ends where an arc is produced by the application of electric power from a source 106*a*, which may be similar to the source 6 of FIG. 1 or the source 26 of FIG. 3. Suitable hydrocarbon, as described herein, is fed from hydrocarbon source 105*a* through hydrocarbon feed tube 107*a* to the reaction zone defined by the arc between the tips of the electrodes 101*a*, 102*a* where the arc causes the carbon from the hydrocarbon to be vaporized. The vaporized carbon is quenched by the surrounding inert gas atmosphere and condensed and collected within the reactor 103 as with the systems of FIGS. 1 and 3.

FIG. 13*b* shows another form of electrode system for the system of FIG. 13*a*, wherein the solid rod shaped electrodes 101*a* and 102*a* are replaced by hollow rod electrodes 101*b* and 102*b* and wherein hydrocarbons from the source of hydrocarbons 105*b* is fed through an axial bore through the center of each of the electrodes 101*b*, 102*b*, to the reaction zone, rather than through a separate feed tube as in FIG. 13*a*.

This modification allows greater feeding in the manner of disposing the electrodes 101*b*, 102*b*, which are shown axially aligned opposite one another, rather than angled as in FIG. 13*a*.

In the case where a gas in addition to the hydrocarbon is used, the hydrocarbon is blended with the non-oxidizing gas and passed through the arc or at least close to the arc, to provide sufficient heat to pyrolyze the hydrocarbons. The operating conditions of the arc system are such that the carbon produced from pyrolysis of the hydrocarbon maximizes formation of the fullerene structure. This typically is a pressure of 100–200 torr but may cover the range of about $10^{-6}$ torr up to several atmospheres.

Arc systems that are typically known as plasma arcs including high enthalpy arc designs, generally do not pass any gas or solid through the electrodes that may react, which in this case is the hydrocarbon. Even if the electrodes are carbides or materials that may be resistant to carbon, the pyrolyzed hydrocarbon can deposit on the electrodes and alter the electrical operation of the arc. For these reasons, the hydrocarbon would typically be added in the downstream flow of the electrodes. In many cases this is satisfactory to transforming hydrocarbon into fullerenes. However, for cases where it is desirable for the hydrocarbon to pass through the arc, graphite electrodes are recommended and if these electrodes vaporize they too can form fullerenes similar to the Huffman/Krätschmer process. An example of this electrode arc system is shown in FIGS. 13*a* and 13*b*. The power source for the electrodes can be direct current or alternating current of any frequency which is the case in any of the arc systems to pyrolyze hydrocarbon and transform to fullerenes.

Figure 14:
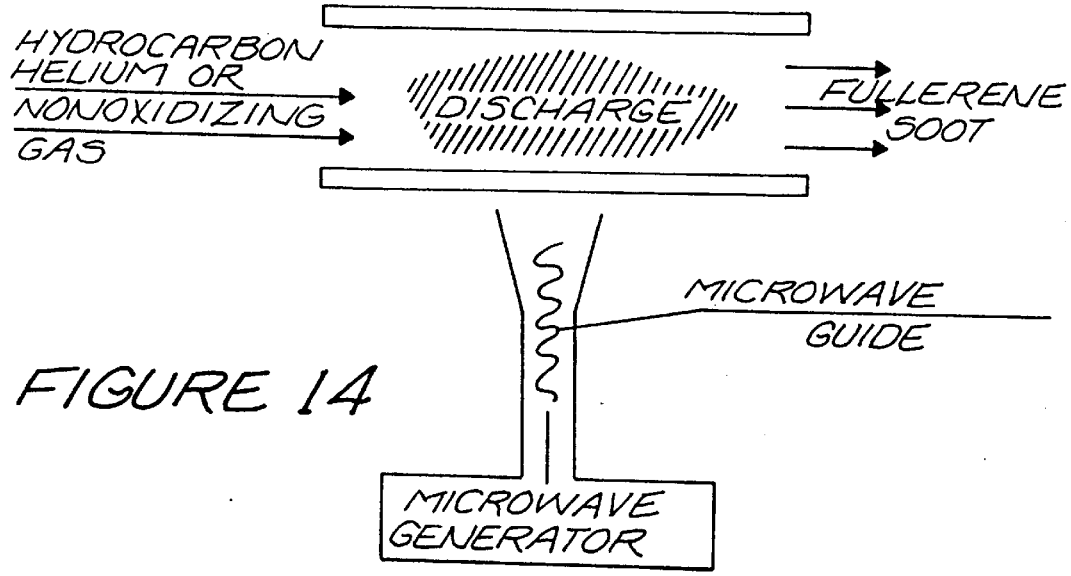
FIG. 14 is a schematic representation of a system for using hydrocarbons as the carbon source and which is modeled after the system of FIG. 10.

As shown in FIGS. 6, 8, 9, 10 and 14, for example, there are a variety of techniques to generate a plasma that do not involve two electrodes. High frequency power is discharged into a cavity which ionizes the gas and generates a plasma. An example of such a system especially fitted to accept a hydrocarbon gas is shown in FIG. 14. The system of FIG. 14 is essentially like that of FIG. 10, except that the input comprises an appropriate hydrocarbon, rather than carbon particulate and quenching gas as shown in FIG. 10. In both FIG. 10 and FIG. 14, the reaction zone of the system is in a closed container for maintaining atmospheric conditions for quenching the vaporized carbon and collecting the fullerenes as in FIG. 1. The frequency of power can be in the range of KHz to MHz. Well known frequencies used to generate plasma are 476 KHz, 3–15 MHz and 2450 MHz which is microwave. In the latter case a wave guide is generally utilized to transmit the power as contrasted to inductive power coils. However, no matter what the frequency, a plasma is generated without or with a noble gas and the hydrocarbon is transformed into fullerenes. The operating conditions are adjusted to favor the quenching of the carbon into the fullerene structure which is preferably 100–200 torr but can be in the range of $10^{-6}$ torr up to several atmospheres.

A laser can also be used with the system shown in FIG. 8 to pyrolyze the hydrocarbon to generate fullerenes. In such cases, the system of FIG. 8 is modified to provide for inputting the hydrocarbon, rather than helium or non-oxidizing quenching gas and the graphite source may be omitted. In any event, the system is closed, as with the system of FIGS. 10 and 14, to provide the quenching of the vaporized carbon, and collection of the fullerenes as in the FIG. 1 system.

Figure 15:
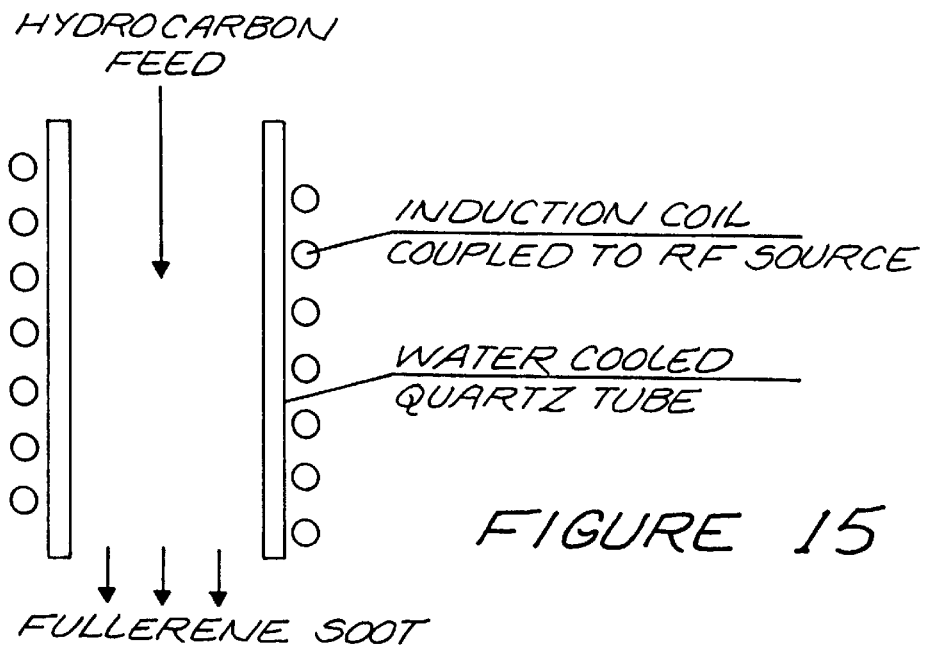
FIG. 15 is a schematic representation of a system for using hydrocarbon as the carbon source and which is modeled after the system of FIG. 6.

FIG. 15 shows a system essentially like that of FIG. 6 wherein the input is a hydrocarbon feed, rather than a carbon particulate feed.

Hydrocarbons may be pyrolyzed by conventional thermal processes that begin as low as just above red heat and can be as high as there are materials that can be heated to transfer the heat to the hydrocarbon. Examples of pyrolyzing hydrocarbons are to produce pyrolytic graphite or highly oriented pyrolytic graphite (HOPG) particulates. If the pyrolytic conditions are set at the conditions that favor condensation of the fullerene structure, then hydrocarbon pyrolysis will produce fullerenes. Examples of suitable reactors are shown in FIGS. 11a and 11b, wherein means are provided to pass the hydrocarbon through a heated tube 150 or over a heated surface 151 with the surrounding conditions in the closed reactor 203 adjusted such that the hydrocarbon pyrolysis is transformed into the fullerene structure. The materials of the tube 150 or heating surface 151 can be those that are easily resistant heated much as the suicides ($MoSi_2$), carbides (Sic, TaC, etc.), the refractory metals such as tungsten or graphite. The closed system 203 contains an appropriate atmosphere for quenching the vaporized carbon, condensing and collecting the fullerene, like that of FIG. 1.

The heating technique for the system shown in FIG. 11 can be an electron beam instead of the resistance heated surface. Such a heating system is illustrated in FIG. 9. In the case of a hydrocarbon source for carbon, the carbon particulate feed is replaced by a source of hydrocarbons as shown in FIGS. 13a and 13b. The hydrocarbon passing through an electron beam will be heated and pyrolyzed to transform into fullerenes. A laser beam may also be utilized to pyrolyze the hydrocarbon as discussed above. The pyrolyzed hydrocarbon can be quenched into controlled temperature profiles and onto controlled temperatures surfaces (heated or cooled) to provide the required conditions to form fullerenes.

The hydrocarbons can be transformed into fullerenes by combustion. It is well known that to burn hydrocarbons with oxygen will produce what is known as a sooty flame, i.e., one that produces uncombusted carbon. The oxygen to carbon ratio can be adjusted to produce a sooty flame and if the surrounding conditions are adjusted to those known to favor fullerene formation, then combustion can be used to produce fullerenes. To favor the temperature profile that forms fullerenes, a shrouded or sheathed burner can be utilized with the sheath a non-oxidizing gas or a burner. An example of a burner of this type is shown in FIG. 12. The sheath burner can be operated with the same fuel or hydrocarbon as the inner burner or different hydrocarbon, or can be supplied with a different oxygen to fuel ratio. The sheath can also be a non-oxidizing gas. Also, such a gas can be injected into the flame to create quenching conditions to favor fullerenes formation. The burner shown in FIG. 12 is referred to as a flat plate burner, but many configuration burners can be used to burn hydrocarbons to produce fullerenes. For example, the burners may be as shown in FIG. 12, the flat plate burner 180 is supplied with fuel form fuel source 181, oxidizer source 182, and diluent 183 via a fuel supply system of a type known in the art of flat plate burners to produce an appropriate combustion at the burner 180. The fuel may be any hydrocarbon, but it is preferably a hydrocarbon having a hydrogen-to-carbon ratio of one (1) or less, since a higher percentage of hydrogen in the hydrocarbon increases the likelihood that the hydrogen will interfere with the cage closure of the fullerenes. Examples of suitable hydrocarbons are acetylene, benzene, toluene, naphthalene and the like.

Advantageously, a two stage fuel preparation system may be used to strip hydrogen (dehydrogenate) the hydrocarbon fuel before passing it into the burner in the reaction zone. For example, hydrocarbon fuel comprising natural gas is passed over a pyrolizer such as that shown in FIG. 11 where it is heated to strip off the hydrogen which is diverted from the fuel stream before it is fed into the burner 180 of FIG. 12. The oxidizer may be air or oxygen. The diluent, if any, may be helium, argon or any noble gas, which may be the inert gas comprising the quench gas.

The carbon particulate or hydrocarbon particulate, or a combination thereof, may be injected under pressure to the flame front in the flat plate burner.

The container comprising the reaction enclosing the burner and reaction zone of the FIG. 12 system must be suitable to contain the quench gas in an atmosphere such as that of FIG. 1 wherein the vaporized carbon is quenched for condensation and collection on appropriate surfaces as in the system of FIG. 1.

Combination Methods

Fullerenes may preferentially be formed by using a combination of heating methods that may include combustion as one method. Since the hydrocarbons contain at least some hydrogen, the combination method may use a first step that would primarily strip the hydrogen and a second step that transforms the hydrocarbon into fullerenes. The combination method could include an arc system plus combustion, arc system plus electroless system, an electrodeless system such as microwave or induction plus combustion, etc.

Figure 16:
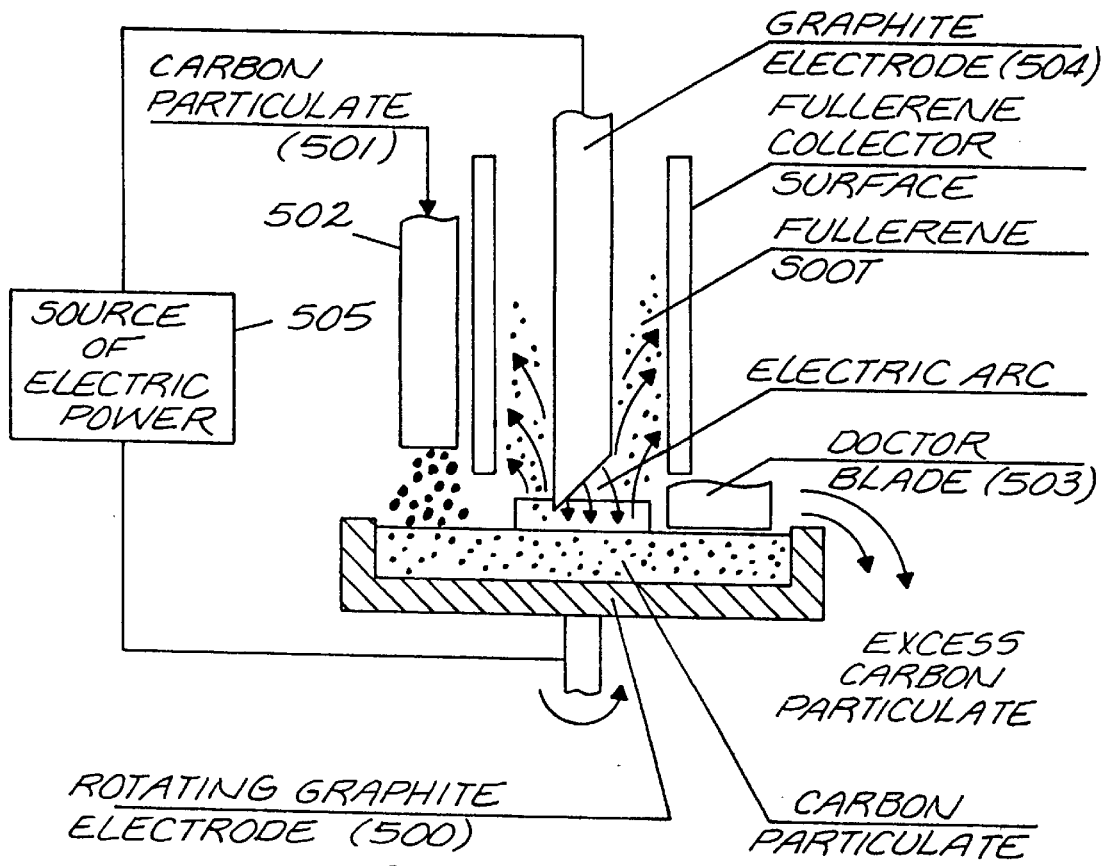
FIG. 16 is a schematic representation of a system generally like that of FIG. 1 but which provides means for continuously passing a bed of carbon particulate through an arc generated between the electrodes.
Figure 17A:
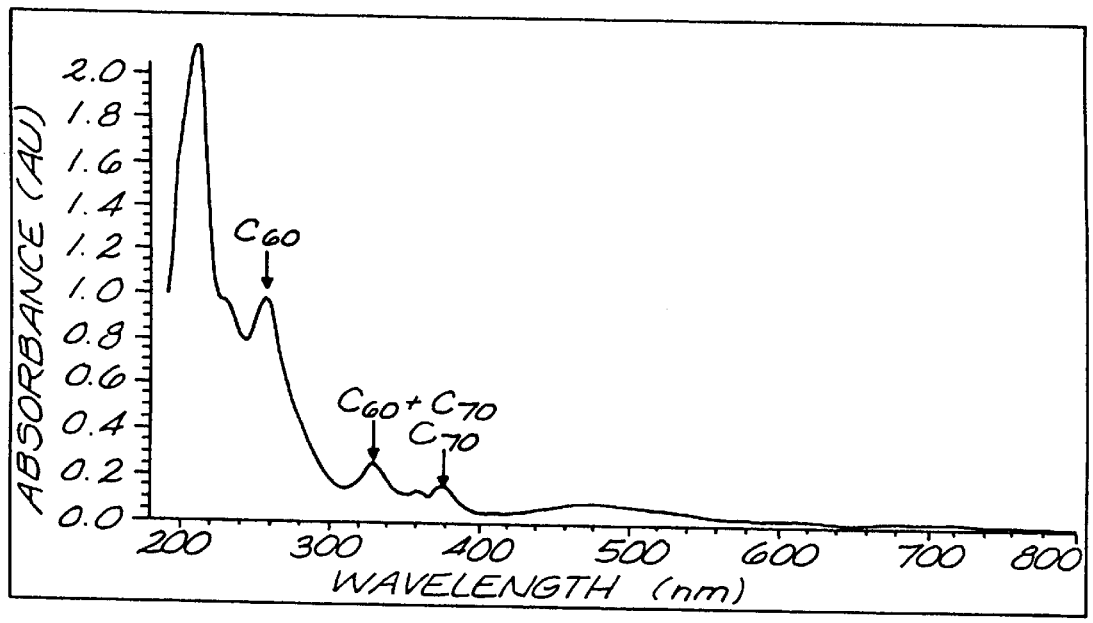
FIGS. 17a and b show the visible-ultraviolet absorption spectrum of collected soot showing the presence of fullerenes as described in examples of the invention.
Figure 17B:
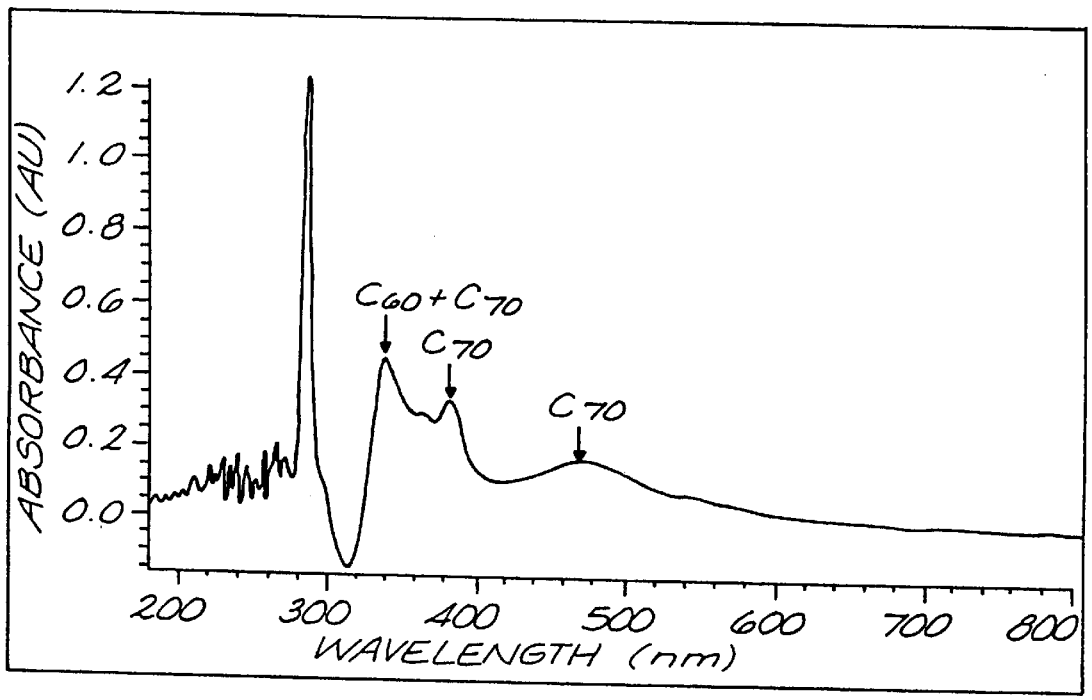

The system shown in FIG. 16 is a modified version of the system shown in FIG. 1 and which is designed to produce fullerenes at a relatively high volume. The FIG. 16 system employs an electric arc to vaporize carbon particulate in an atmosphere like that of FIG. 1, wherein a suitable quenching medium is confined within a reactor, wherein the electric arc vaporizes the carbon to produce fullerenes that are collected from the quenched carbon vapor. In FIG. 16 the electrode system comprises a generally disc shaped graphite electrode 500 having an outer rim rising above its outer edge to prevent carbon particulate from being thrown off its upper surface by centrifugal force when the disc is rotated below a rod shaped graphite electrode 504 positioned above and generally perpendicular to the flat surface of the disc 500. Carbon particulate is fed to the top of the disc 500 as it is rotated by means of a suitable electric motor or the like (not shown). An electric power source 505, such as the power source 6 of FIG. 1, is coupled to the electrodes 500, 504 to produce an electric arc between the tip of the rod 504 and carbon particulate on the surface of the disc electrode 500 causing the particulate to vaporize in the reactor where it is quenched, condensed and collected as fullerene soot as with the system of FIG. 1. A smoothing blade, known as a Doctor blade 503 is mounted above the surface of the disc 500 to smooth the surface of the carbon particles 501 deposited thereon, thereby maintaining a substantially uniform thickness in the layer of particles as the disc rotates and the particles pass through the arc between the disc 500 and the tip of the rod 504.

The system of FIG. 16 is described further in the description of example 15 infra.

EXAMPLE 1

Using a system as illustrated in FIG. 1, carbon particulates as calcined petroleum coke in the size range of 40 to 6250 microns was put into container 3 which was a graphite crucible two inches in diameter. Electrode 1 was a graphite rod one inch in diameter and was connected as the cathode to a dc power supply. System comprising chamber 3 was pumped to $10^{-3}$ torr, backfilled with argon, repumped to $10^{-3}$ torr and backfilled to 200 torr with helium. An arc was created by lowering electrode 1 to touch carbon particles 4 supported in the crucible 2 and then raised whence the arc was maintained at 20 volts and a current of 125 amps. The carbon particles 4 were consumed as the anode and carbon soot was generated. The soot condensed on the walls of the vacuum chamber 3. After thirty minutes of operation the arc was stopped by raising electrode 1 and turning off the power. The soot on the wall was collected and shown to have 10% solubility in toluene which is characteristic of fullerenes.

Examination of electrode 1, the cathode, revealed that a solid deposit of carbon had formed around the edges of the electrode. This solid deposit of carbon was easily broken from the edges of the electrode and it was noted some pieces of such carbon had fallen off electrode 1 and was laying on top of the particle bed 4. This solid deposit of carbon was examined utilizing a transmission electron microscope and found to contain a tubular shape of fullerenes.

EXAMPLE 2

The carbon particulates of example 1 was in the size range of 1000 to 10,000 microns and the power was 60 cycle alternating current. Surrounding container 2 and electrode 1 was a water cooled heat exchanger made from ¼ inch copper tube. Carbon particulate 4 was put into the particulate feed tube 5. The experiment was run at a higher power of 30 V and 175 amps. As the carbon particulate was consumed, additional particulate fell into container 2 from feed tube 5. After two hours operation, the generated soot was collected from the heat exchanger surfaces and the vacuum chamber walls. The soot fraction that dissolved in toluene was 8.5% indicating fullerenes by the characteristic cordova to near black color after filtering out the undissolved soot.

EXAMPLE 3

Example 1 was repeated with heat exchanger from Example 2 but using argon as the residual gas instead of helium. The fullerene yield in the soot was 5%.

EXAMPLE 4

Example 3 was repeated but the residual gas was acetylene and the fullerene yield was 3.8%.

EXAMPLE 5

Example 3 was repeated with the residual helium pressure at 500 torr and the fullerene yield was 7.6%.

EXAMPLE 6

Carbon particulate which was reclaimed automobile tire carbon black was fed into an arc plasma as shown in FIG. 2 using helium as the working gas. The discharge of the jet was in chamber 3 of example 1 to prevent any oxidation of the vaporized carbon particulate. Chamber 3 was maintained at a pressure of 150 torr. The vaporized carbon soot was collected from the walls of chamber 3 and found to contain 8% toluene soluble fullerenes.

EXAMPLE 7

Cabot Utility Grade Black Pearls 130 carbon particulate was utilized and fed into an arc configuration shown in FIG. 3 utilizing helium working gas with chamber 3 operating at 760 torr in a residual atmosphere of mixed helium and argon. Three heat exchanger types were utilized to collect the soot in chamber 3. The circular water cooled copper tubing of example 2 was utilized closest to the arc discharge. Downstream of the circular heat exchanger a water cooled flat plate was utilized and maintained at a angle of approximately 45° to the perpendicular of the arc issuing from the electrode. In a similar but opposite plane, an uncooled graphite plate was utilized to collect soot. After operating the arc for ½ hour, soot was collected from all three heat exchanger surfaces and the walls of chamber 3. The circular heat exchanger soot contained 3% fullerenes, the flat plate 5% fullerenes, the graphite plate 6% and the chamber walls 4.5% fullerenes.

EXAMPLE 8

Example 6 was repeated with the heat exchangers of example 7 with the graphite replaced with grafoil and the copper cooled heat exchangers lined with grafoil. Chamber 3 was maintained at 50 torr pressure with a residual gas of argon. The feed or working gas with the carbon particulate was acetylene. The carbon particulate was the insoluble soot from other fullerene runs. The soot collected in this experiment demonstrated an average fullerene content of 6% as measured by toluene solubility.

EXAMPLE 9

A four liter glass beaker was filled with toluene in a system as depicted in FIG. 4. Two one inch graphite electrodes were inserted with 1000 to 5000 micron carbon particulate filled ½ inch deep between the electrodes. An ac welding power supply was attached to the graphite electrodes with a power of 35 V. The current was 80 amps with values in the 50 to 120 amp range. Multiple arc points could be seen between carbon particulates. Within a few seconds the solution began to turn tan and as time progressed, the solution turned darker. After a few minutes, the toluene solution began to boil and the experiment terminated. The toluene was filtered to separate the carbon particulate and any non-fullerene soot. The remaining solution contained 3% fullerenes.

EXAMPLE 10

Experiment 9 was repeated using methylnaphthalene in the solvent with a pump installed to pass the solvent through a refrigerated heat exchanger. The beaker was set on a vibrating table and a pulsed power supply was utilized. The pulsed rate was 15 Hz at a power of 400 V and 30 amps. The experiment was run for one hour and the solution filtered to remove the graphite particles and non-fullerene soot. After evaporation of the methylnaphthalene the fullerene content was 4.2%.

EXAMPLE 11

Petroleum coke carbon particulates in the size range of 40–1000 microns was fed to the plasma region as shown in FIG. 5 with a chamber pressure of 300 torr using a working gas of 50 helium 50 argon. The petroleum coke particulate was volatilized in the plasma and soot collected on the walls of the vacuum chamber. Toluene solubility showed that the collected soot had 5% fullerenes.

EXAMPLE 12

The system in FIG. 5 was modified such that the anode was a solid block of graphite three inches in diameter. No carbon particulate were fed into the plasma. The vacuum chamber was maintained at 200 torr with 50% argon-helium. The plasma vaporized the anode block and soot was collected on the walls of the vacuum chamber. The soot contained 7% toluene soluble fullerenes.

EXAMPLE 13

A 40K Lapel induction power supply with 476 KHz and 3–8 MHz frequencies was utilized at approximately 5 MHz. A four turn coil was wrapped around a two inch diameter water cooled quartz tube as generally shown in FIG. 6. A venture powder feed system was utilized to feed carbon black from reclaimed automobile tires. The pressure was reduced to one torr with helium which generated a plasma at about 5 KW. The power was increased to about 15 KW and carbon black was fed into the plasma which was vaporized generating a soot that was collected on the water cooled walls of the quartz container. The soot was tested for fullerene solubility in toluene and found to contain 6% fullerenes.

EXAMPLE 14

The experiment in example 13 was repeated and the operating gas helium was passed through benzene which was passed into the plasma. The flow was adjusted to achieve an approximate 50:50 helium-benzene mixture in the gas phase. The pressure was adjusted to be 10 torr and carbon power feed was begun. The soot collected on the water cooled quartz walls contained 7% fullerenes.

EXAMPLE 15

An example of high volume production of fullerenes was demonstrated utilizing the system shown in FIG. 16. A rotating flat graphite plate 500 is fed with carbon particulate 501 through feed tube 502. The smoothing blade, which is known in the art as a doctor blade 503, smoothes the carbon particulate to pass under electrode 504 which is the cathode when using a dc power supply. Electrode 504 may be any material as desribed in FIGS. 1, 3 and 13 and has a slight taper to control the arc distance with the carbon partiuclate on the flat graphite plate. A dc power supply 505 was utilized with a voltage of 25 V and a current of 175 amps. Graphite plate 500 was slowly rotated at 10 revolutions per hour with carbon particulate fed and consumed at approximately 100 grams per hour. Larger electrodes 504 and graphite plate 500, as well as multiple cathode elctrodes 504, can vaporize more carbon particulate in unit time. Helium was used as the working gas at a pressure of 150 torr. Heat exchangers as described in FIGS. 2, 3 and 4, were used to condense the carbon vapor. The soot collected off the heat exchangers contained 12% toluene soluble fullerenes.

EXAMPLE 16

A quartz tube was utilized in the system shown in FIG. 10. A 5 KW microwave system was utilized to generate a helium plasma in the quartz tube at 1 torr. Carbon black was fed with a venturi feed as described in example 13. The quartz tube was forced air cooled at the extremities of the plasma. The plasma volatilized the carbon black particulate and the soot condensed on the cooled quartz tube. Fullerene content as toluene soluble was 5.5%.

EXAMPLE 17

Carbon particulate in the size of 1000–10,000 micron was placed in an aluminum container as shown in FIG. 7. The magnets can be permanent or electromagnets which in this case had a rating of approximately 10 gauss at 55 V and 4 amps. The dc sputtering power was run at 500 V dc and 20 amps at a pressure of 0.01 torr residual helium. A water cooled copper plate with a grafoil surface as described in example 7 was utilized adjacent to the anode-cathode spacing. The experimental run was made for one hour and the soot collected on the grafoil surface, as well as the vacuum chamber walls of the sputtering systems. The soot showed 3% fullerenes by toluene solubility test.

EXAMPLE 18

Example 16 was repeated using a solid block of graphite and the sputtering gas was 50 helium:50 argon with a pressure of 0.03 torr. The sputtering power supply was 2 KW microwave. Soot collected on the grafoil heat exchanger surface and walls of the vacuum chamber showed 3.3% fullerenes.

EXAMPLE 19

Two electron beam guns as shown in FIG. 9 were utilized in a vacuum of $10^{-6}$ torr in vacuum chamber 83. Carbon particulate with a particle size in the general range of 1 to 40 micron was fed through tube 86 into the electron beams operating at 14 KVA. The circular copper, flat plate copper and graphite slab heat exchanger as described in example 7 were utilized around and below the electron beam. The vacuum chamber was lined with aluminum foil. The experiment was contained for one hour at an electron beam power of approximately 7 KW. The soot collected on the heat exchangers and aluminum foil liner of the vacuum chamber contained 4% fullerenes. The extracted fullerenes were dried onto neutral alumina and placed on top of a neutral alumina packed chromatographic column one inch in diameter. Techniques for purification and separation of $C_{60}$ and $C_{70}$ are known in the art and are discussed, for example, in the PCT patent application of Huffman et al published 19 Mar. 1992 (19.03.92) International Publication Number WO92/04279. See especially pages 13, 14. Hexane was used to flush the column by standard chromatographic technique also known for separating $C_{60}$, $C_{70}$ and higher fullerenes. See also F. Diederick et al "The Higher Fullerenes: Isolation and Characteristics of $C_{76}$, $C_{84}$, $C_{90}$, $C_{94}$ and $C_{70}O$ an Oxide of $D_{5h}$–$C_{70}$, Science vol. 252, pg. 548. It was noted the ratio (band width of absorbed material in the columns) of $C_{60}$, $C_{70}$ and higher molecular weight fullerenes was substantially different from that obtained from fullerenes synthesized by the graphite rod method of Huffman/Krätschmer. The typical ratio of fullerenes in the Huffman/Krätschmer technique is $92C_{60}$–4 to 6 $C_{70}$ and 2 to 4 higher fullerenes. The fullerenes produced by the electron beam showed approximately 20 $C_{60}$–50 $C_{70}$–30 higher fullerenes.

EXAMPLE 20

The system in FIG. 2, low hydrogen to carbon ratio hydrocarbons are fed to the reaction zone instead of particulate carbon. The plasma is started with an inert gas such as argon and acetylene is added in place of carbon particulate. The acetylene is cracked producing carbon soot which is collected as previously described. The soot was dissolved in toluene and found to contain 2% fullerenes.

EXAMPLE 21

Figure 18:
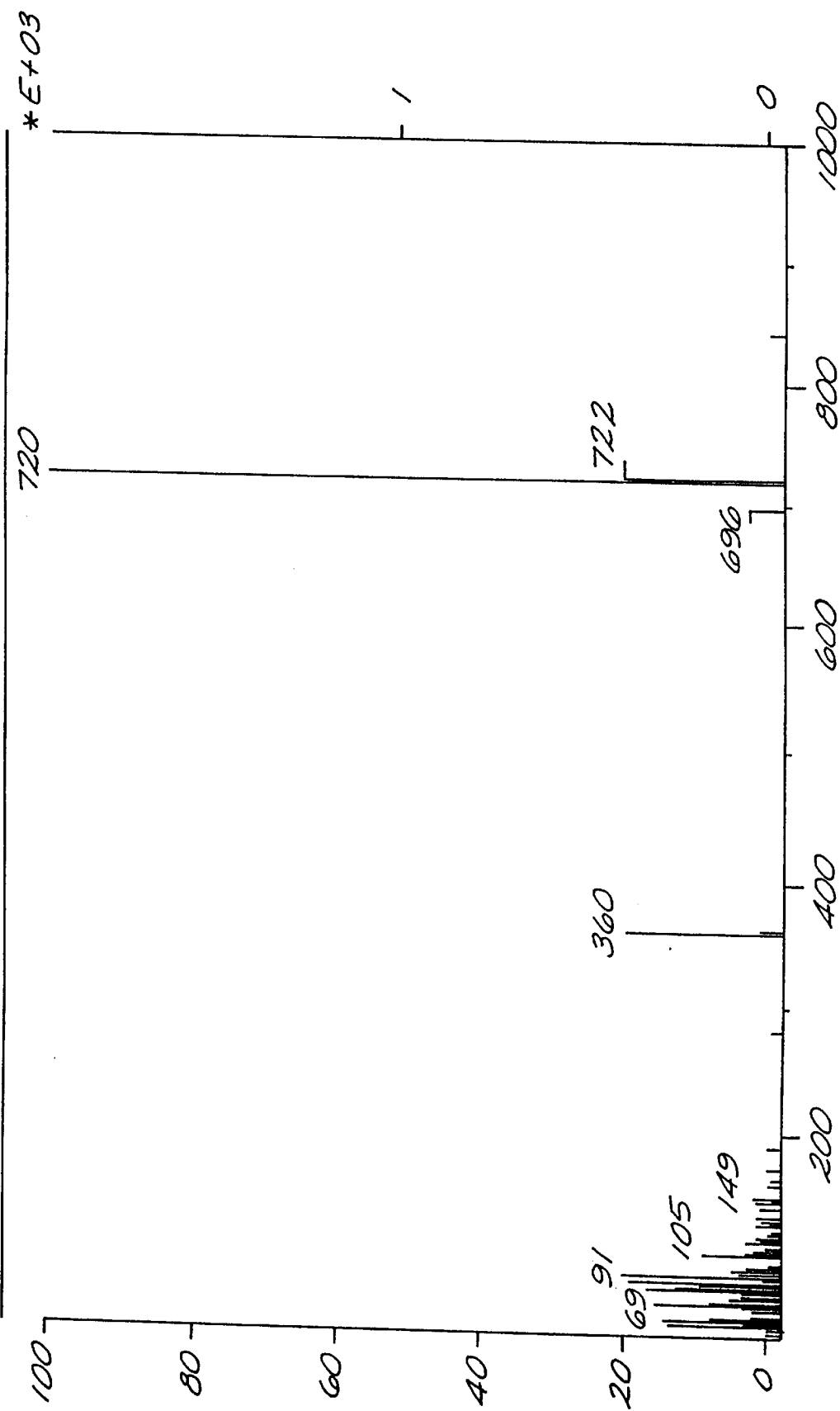
FIG. 18 shows the mass spectrograph of collected soot showing the presence of primarily $C_{60}$ as described in example 21.

Example 20 was repeated using a system in Example 19 in which the plasma gas was helium. The collected soot contained only $C_{60}$ as shown in the mass spectrograph of FIG. 18.

EXAMPLE 22

Example 20 was repeated and naphthalene was fed as a solid similarly to the carbon particulate. The cracked naphthalene soot was collected as before and found to contain 2.5% soluble fullerenes.

EXAMPLE 23

The system shown in FIG. 3 was utilized and benzene vapor was fed in place of the carbon particulates. The cracked benzene soot was collected as previously described and found to contain 3.3% soluble fullerenes.

EXAMPLE 24

The electrodes in Example 3 were made of graphite tubes through which a mixture of acetylene and benzene were fed which was cracked to a soot that had 4.5% soluble fullerenes.

EXAMPLE 25

The system in FIG. 6 was utilized and anthracene was fed in solid particulate form instead of carbon particulate and the cracked soot collected as previously described. The cracked soot contained 4.1% soluble fullerenes.

EXAMPLE 26

The system shown in FIG. 8 was utilized and naphthalene granules were fed into the tube in front of the graphite backing plate using a $CO_2$ laser which produced a soot containing 1% soluble fullerenes.

EXAMPLE 27

The system in FIG. 9 was utilized in which naphthalene was fed into the electron beams which were cracked and produced a soot that contained 5% toluene soluble fullerenes.

EXAMPLE 28

A mixture of acetylene and benzene was fed into the microwave plasma of helium, shown in FIG. 14, which was cracked and produced a soot containing 3.8% soluble fullerenes.

EXAMPLE 29

A system as shown in FIG. 11b was utilized that contained a tungsten filament. The pressure in the system was adjusted to 150 torr helium and the filament heated to 2800° C. Acetylene was passed over the hot filament that cracked it into soot which contained 2.7% fullerenes.

EXAMPLE 30

Experiment 28 was repeated with a system as in FIG. 11b using natural gas and a carbon filament. The fullerene contained in the soot was 1%.

EXAMPLE 31

A burner system as shown in FIG. 12 was utilized. Naphthalene was fed by vaporizing into the flame. The outer shielding was natural gas and oxygen burned at a slightly reducing ratio. The naphthalene-oxygen flame was burned to produce soot or referred to as a sooting flame. The soot was collected on heat exchangers as described in FIGS. 2, 3 and 4 and found to contain 7% soluble fullerenes.

EXAMPLE 32

Example 30 was repeated and carbon particulate was used as the fuel to the inner burner with the flame set to be a sooting flame. The soot was collected and found to contain 7.5% soluble fullerenes.

EXAMPLE 33

Example 30 was repeated with the fuel a mixture of natural gas and carbon particulate and the shielding flame was omitted with a shield of helium gas. A sooting flaming condition was set in the burner and the soot collected. The soot contained 4.3% fullerenes.

EXAMPLE 34

Example 31 was repeated in which the microwave generator of FIG. 14 was directed across the sooting flame in which the fuel source was methylnaphthalene, the shielding flame was also used. Greater quantities of soot were produced and the soluble fullerenes were found to be 10% on the water cooled heat exchangers.

EXAMPLE 35

The electrode system in FIG. 3 was combined with the electrodeless induction plasma of FIG. 6 and carbon particulate was fed through electrodes 21 and 22. The working gas was helium and the pressure in system 3 was 10 torr. The combined plasma vaporized the carbon particulate which was collected on heat exchangers as described in FIGS. 2, 3 and 4. The soot from the heat exchanger contained 12% soluble fullerenes.

EXAMPLE 36

The experiment of example 35 was repeated with benzene as the carbon feed source. The helium working gas was passed through liquid benzene and through the electrodes 21 and 22. The collected soot contained 9% soluble fullerenes.

The above embodiments and examples are given to illustrate the scope and spirit of the instant invention. These embodiments and examples are within the contemplation of the present invention. Therefore, the present invention should be limited only by the appended claims.

What is claimed is:

1. A method of producing fullerenes which comprises: providing a source of elemental carbon selected from the group consisting of particulate carbon and fluid hydrocarbons, subjecting said source to heat in a reaction zone in a non-oxidizing environment to form evaporated elemental carbon, quenching the evaporated elemental carbon with a quenching medium to condense said evaporated elemental carbon, collecting the resulting quenched carbon product containing at least one fullerene and recovering said fullerene from said product.

2. A method as defined in claim 1, wherein the source of elemental carbon is a particulate form thereof.

3. A method as defined in claim 2 wherein the particulate carbon is in a fixed stationary bed.

4. A method as defined in claim 2 wherein the particulate carbon is in a fluidized bed.

5. A method as defined in claim 1, wherein the source of elemental carbon comprises a fluid hydrocarbon.

6. A method as defined in claim 5, wherein the fluid hydrocarbon comprises a gaseous hydrocarbon.

7. A method as defined in claim 6 wherein the gaseous hydrocarbon also serves as the quenching medium.

8. A method as defined in claim 5 wherein the fluid hydrocarbon comprises a liquid hydrocarbon.

9. A method as defined in claim 8 wherein the liquid hydrocarbon also serves as the quenching medium.

10. The method of claim 1 wherein at least one fullerene is separated from the quenched carbon product by sublimation.

11. The method of claim 2 wherein the quenching medium comprises an atmosphere of an inert quenching gas introduced into an evacuated reactor and contained therein at an effective pressure for the formation of fullerenes.

12. The method of claim 11 wherein the quenched carbon product is collected as a condensate on a collecting surface within said reactor.

13. The method of claim 11 wherein at least one fullerene is separated from the condensed carbon product by contacting said product with an extracting non-polar organic solvent under effective conditions to separate the fullerene therefrom.

14. The method of claim 1 wherein the quenching medium is contained within a reactor vessel and comprises a liquid hydrocarbon effective to solubilize fullerenes.

15. The method of claim 1 wherein the source of elemental carbon is continuously fed to the reaction zone as heat is applied thereto to vaporize the source into evaporated elemental carbon.

16. The method of claim 2 wherein the particulate carbon is continuously fed to the reaction zone as heat is applied thereto to vaporize the carbon.

17. The method of claim 4 wherein the particulate carbon is continuously fed to the reaction zone as heat is applied thereto to vaporize the carbon.

18. The method of claim 2 wherein the reaction zone is subjected to heat generated by the application of electric power effective to produce an arc between said particulate form of carbon in the reaction zone and an adjacent electrode.

19. The method of claim 14 wherein the source of elemental carbon comprises carbon particles and the reaction zone is subjected to heat generated by the application of electric power effective to produce an arc between said carbon particles in the reaction zone and an adjacent electrode.

20. The method of claim 15 wherein the source of elemental carbon comprises carbon particles and the reaction zone is subjected to heat generated by the application of electric power effective to produce an arc between said carbon particles in the reaction zone and an adjacent electrode.

21. The method of claim 16 wherein the reaction zone is subjected to heat generated by the application of electric power effective to produce an arc between said particulate carbon in the reaction zone and an adjacent electrode.

22. The method of claim 16 wherein an electrode system is employed to heat the reaction zone and the particulate carbon is fed to the reaction zone downstream of the electrodes of the electrode system.

23. The method of claim 16 wherein the heat is produced in the reaction zone by the application of an electric current to the electrodes of an arc plasma system, wherein quenching medium is caused to flow past the electrodes of the arc plasma system whereby the heated reaction zone extends downstream of the electrodes and wherein the particulate carbon is fed to the reaction zone downstream of the electrodes.

24. The method of claim 18 wherein the particulate carbon is fed through an opening in the adjacent electrode to the reaction zone.

25. The method of claim 1 wherein the reaction zone is subjected to heat generated in a plasma therein that is induced by an alternating electric current.

26. The method of claim 1 wherein the reaction zone is subjected to heat generated in a plasma therein that is induced by a direct current.

27. The method of claim 2 wherein the reaction zone is subjected to heat generated in a plasma therein that is induced by the application of an alternating electric current produced in an induction coil surrounding at least a portion of the reactor.

28. The method of claim 16 wherein the reaction zone is subjected to heat generated in a plasma therein that is induced by the application of an alternating electric current produced in an induction coil surrounding at least a portion of the reactor.

29. The method of claim 25 wherein the alternating electric current applied to induce the plasma is in the microwave frequency range.

30. The method of claim 25 wherein the alternating electric current applied to induce the plasma is in the megahertz frequency range.

31. The method of claim 1 wherein the reaction zone is subjected to heat generated by a sputtering system wherein inert gas is ionized, accelerated and directed to impinge upon carbon atoms in the reaction zone.

32. The method of claim 2 wherein the reaction zone is subjected to heat generated by a sputtering system wherein inert gas is ionized, accelerated and directed to impinge upon carbon atoms in the reaction zone.

33. The method of claim 16 wherein atoms in the reaction zone are subjected to heat generated by a sputtering system wherein inert gas is ionized, accelerated and directed to impinge upon carbon atoms in the reaction zone.

34. The method of claim 1 wherein the reaction zone is subjected to heat generated by a laser beam directed to impinge upon carbon atoms in the reaction zone.

35. The method of claim 2 wherein the reaction zone is subjected to heat generated by a laser beam directed to impinge upon carbon atoms in the reaction zone.

36. The method of claim 16 wherein the reaction zone is subjected to heat generated by a laser beam directed to impinge upon carbon atoms in the reaction zone.

37. The method of claim 1 wherein the reaction zone is subjected to heat generated by an electron beam directed to impinge upon carbon atoms in the reaction zone.

38. The method of claim 2 wherein the reaction zone is subjected to heat generated by an electron beam directed to impinge upon carbon atoms in the reaction zone.

39. The method of claim 16 wherein the reaction zone is subjected to heat generated by an electron beam directed to impinge upon carbon atoms in the reaction zone.

40. The method of claim 34 wherein the quenching medium comprises an atmosphere of an inert quenching gas at a pressure in the range of $10^{-3}$–$10^{-6}$ torr.

41. The method of claim 37 wherein the quenching medium comprises an atmosphere of an inert quenching gas at a pressure in the range of $10^{-3}$–$10^{-6}$ torr.

42. The method of claim 14 wherein a fullerene is produced as a quenched carbon product dissolved in said liquid hydrocarbon quenching medium and wherein said fullerene is recovered therefrom.

43. The method of claim 14 wherein the liquid quenching medium in the reaction zone is maintained essentially at atmospheric pressure.

44. The method of claim 19 wherein the electric power is applied in a pulsed manner.

45. The method of claim 5 wherein the reaction zone is subjected to heat generated in a plasma started with an inert gas.

46. The method of claim 45 wherein the inert gas is argon.

47. The method of claim 45 wherein the inert gas is helium.

48. The method of claim 45 wherein the hydrocarbon has a hydrogen to carbon ratio of one or less.

49. The method of claim 48 wherein the inert gas is helium, whereby the carbon product comprises substantially pure carbon in the form of $C_{60}$.

50. The method of claim 45 wherein the hydrocarbon is acetylene.

51. The method of producing fullerenes of claim 1 wherein the source of elemental carbon is supplied to the reaction zone as a component of a hydrocarbon, and wherein the reaction zone is heated to a temperature effective to the hydrocarbon.

52. The method of claim 51 wherein the hydrocarbon is acetylene.

53. The method of claim 51 wherein the hydrocarbon has a hydrogen to carbon ratio of one or less.

54. The method of claim 51 wherein the quenching medium comprises helium in an atmosphere of $10^{-6}$ to 760 torr.

55. The method of claim 51 wherein the hydrocarbon is natural gas.

56. The method of claim 55 wherein the quenching medium comprises helium in an atmosphere of $10^{-6}$ to 760 torr.

57. The method of claim 51 wherein the heat is produced by applying a source of electric power to a resistance element positioned in the reaction zone.

58. The method of claim 57 wherein the resistance element is a tungsten filament.

59. The method of claim 57 wherein the resistance element is a carbon filament.

60. The method of claim 51 wherein the source of elemental carbon is supplied to the reaction zone as a combination of a hydrocarbon and particulate carbon.

61. The method of claim 1 wherein heat is supplied to the reaction zone by an electric arc produced by the application of direct current between the source of elemental carbon and an adjacent electrode, that is the cathode of the arc system and wherein quenched carbon product deposited on the cathode is selectively collected.

62. The method of claim 61 wherein the source of elemental carbon is a particulate form thereof.

63. The method of claim 61 wherein the quenching medium is a noble gas.

64. The method of claim 63 wherein the noble gas is helium at 200 torr.

65. The method of claim 64 wherein the reaction zone is in a reaction zone that is prepared by pumping it to $10^{-3}$ torr, backfilling with argon, re-pumping to $10^{-3}$ torr and backfilling with helium to 200 torr.

66. The method of claim 62 wherein the quenching medium is a noble gas.

67. A process for making fullerenes comprising:

(a) providing a carbon vapor generation zone which comprises a first electrode and a second electrode, (b) maintaining the carbon vapor generation zone in a non-oxidizing atmosphere (c) applying sufficient electrical voltage to the first electrode to maintain an electrical arc between the first and the second electrode, (d) providing a carbon source in close proximity to the electrical arc by passing graphite dust around or through the electrical arc, so that the carbon source is heated by the electrical arc to form a carbon vapor, (e) passing the carbon vapor to a fullerene condensing zone where the carbon vapor is condensed into a solid carbon soot, and (f) recovering fullerenes from the carbon soot.

68. A process in accordance with claim 67 wherein the graphite dust is carried to the electrical arc by an inert gas.

69. A process in accordance with claim 68 wherein the inert gas is helium, and the carbon vapor generation zone and fullerene condensing zone are maintained in an atmosphere consisting essentially of helium at a pressure of 10 to 700 Torr.

* * * * *

UNITED STATES PATENT AND TRADEMARK OFFICE
CERTIFICATE OF CORRECTION

PATENT NO. : 5,876,684
DATED : March 2, 1999
INVENTOR(S) : James C. Withers et al.

It is certified that error appears in the above-identified patent and that said Letters Patent is hereby corrected as shown below:

<u>Column 21,</u>
Line 44, after "effective to", -- insert crack --.

Signed and Sealed this

Eleventh Day of December, 2001

*Attest:*

*Nicholas P. Godici*

*Attesting Officer*

NICHOLAS P. GODICI
*Acting Director of the United States Patent and Trademark Office*